United States Patent [19]

Watanabe et al.

[11] Patent Number: 5,691,249
[45] Date of Patent: *Nov. 25, 1997

[54] METHOD FOR FABRICATING POLYCRYSTALLINE SILICON HAVING MICRO ROUGHNESS ON THE SURFACE

[75] Inventors: Hirohito Watanabe; Toru Tatsumi, both of Tokyo, Japan

[73] Assignee: NEC Corporation, Tokyo, Japan

[21] Appl. No.: 447,561

[22] Filed: May 23, 1995

[*] Notice: The term of this patent shall not extend beyond the expiration date of Pat. No. 5,366,917.

Related U.S. Application Data

[62] Division of Ser. No. 177,995, Jan. 6, 1994, which is a division of Ser. No. 672,073, Mar. 19, 1991, Pat. No. 5,366,917.

[30] Foreign Application Priority Data

| Mar. 20, 1990 | [JP] | Japan | 2-72462 |
| Sep. 19, 1990 | [JP] | Japan | 2-249154 |
| Nov. 28, 1990 | [JP] | Japan | 2-327069 |

[51] Int. Cl.⁶ .................................... H01L 21/205
[52] U.S. Cl. .................. 437/233; 437/919; 437/60; 437/977
[58] Field of Search ................. 437/101, 109, 437/233, 977, 52, 60, 235, 919, 967; 148/DIG. 14, DIG. 122, DIG. 138; 257/309

[56] References Cited

U.S. PATENT DOCUMENTS

| 4,301,588 | 11/1981 | Horng et al. | 437/31 |
| 4,441,249 | 4/1984 | Alsapctor et al. | 437/919 |
| 4,742,018 | 5/1988 | Kimura et al. | 437/48 |
| 4,757,360 | 7/1988 | Faraone | 257/317 |
| 4,774,202 | 9/1988 | Pan et al. | 257/317 |
| 4,874,716 | 10/1989 | Rao | 437/60 |
| 4,905,072 | 2/1990 | Komatsu et al. | 357/59 |
| 4,951,175 | 8/1990 | Kurosawa et al. | 437/47 |
| 5,017,505 | 5/1991 | Fujii et al. | 437/52 |
| 5,025,741 | 6/1991 | Suwani et al. | 437/52 |
| 5,037,773 | 8/1991 | Lee et al. | 437/919 |
| 5,061,650 | 10/1991 | Dennison et al. | 437/47 |
| 5,064,779 | 11/1991 | Hasegawa | 437/233 |
| 5,070,032 | 12/1991 | Yuan et al. | 437/42 |
| 5,102,813 | 4/1992 | Kobayashi et al. | 434/101 |
| 5,110,752 | 5/1992 | Lu | 437/52 |
| 5,114,873 | 5/1992 | Kim et al. | 437/60 |
| 5,124,767 | 6/1992 | Koyama | 257/309 |
| 5,183,772 | 2/1993 | Jin et al. | 437/60 |
| 5,227,651 | 7/1993 | Kim et al. | 257/309 |
| 5,245,206 | 9/1993 | Chu et al. | 257/309 |
| 5,270,224 | 12/1993 | Furumura et al. | 437/101 |
| 5,290,729 | 3/1994 | Hayashide et al. | 437/977 |
| 5,302,844 | 4/1994 | Mizuno et al. | 257/532 |
| 5,304,505 | 4/1994 | Hazani | 437/477 |
| 5,385,863 | 1/1995 | Tatsumi et al. | 437/919 |

FOREIGN PATENT DOCUMENTS

| 2199987A | 7/1988 | European Pat. Off. . | |
| 0 281 233 | 9/1988 | European Pat. Off. . | |
| 0598410A1 | 2/1989 | European Pat. Off. | 437/233 |
| 3 628 374 | 2/1988 | Germany . | |
| 3 915 594 | 11/1989 | Germany . | |
| 64-42161 | 2/1989 | Japan . | |
| 0203557 | 8/1990 | Japan | 257/309 |

OTHER PUBLICATIONS

T. Mine et al., "Capacitance–Enhanced Stacked–Capacitor with Engraved Storage Electrode for Deep Submicron DRAMs," *Solid State Devices and Materials*, Aug. 28–30, 1989, pp. 137–140.

(List continued on next page.)

*Primary Examiner*—John Niebling
*Assistant Examiner*—S. Mulpuri
*Attorney, Agent, or Firm*—Sughrue,Mion,Zinn,Macpeak & Seas, PLLC

[57] ABSTRACT

A method for fabricating a polycrystalline silicon having a roughed surface, which is useful for a capacitor electrode is disclosed. The method is featured by depositing a polycrystalline silicon layer in such a manner that grains of silicon are caused at the surface of the polycrystalline silicon layer. The polycrystalline silicon layer thus obtained has a large effective surface area and is suitable for a capacitor electrode because of its increased effective surface area.

20 Claims, 34 Drawing Sheets

OTHER PUBLICATIONS

Patent Abstracts of Japan, Unexamined Applications, E Field, vol. 13, No. 344, Aug. 3, 1989, The Patent Office Japanese Government, p. 36 E 797 Kokai–No. 1–102 918 (NEC).

H. Cerva et al., "Microstructure and Interfaces of Polysilicon in Integrated Circuits," Polycrystalline Semiconductors, Grain Boundaries and Interfaces, Proceedings of the International Symposium, Malente, West Germany, 29 Aug.–2 Sep. 1988, *Springer Proceedings in Physics,* vol. 35, pp. 354–365.

Hyung Sup Yoon et al., "Structure and Electrical Resistivity of Low Pressure Chemical Vapor Deposited Silicon," *J. Vac. Sci. Technol. A,* vol. 4, No. 6, Dec. 1986, pp. 3095–3100.

H. Watanabe et al., "A New Stacked Capacitor Structure Using Hemispherical–Grain (HSG) Poly–Silicon Electrodes," Extended Abstracts of the 22nd 11990 International Conference on Solid State Devices and Materials, Sendai, 1990, pp. 873–876.

FIG. 13a
FIG. 13b
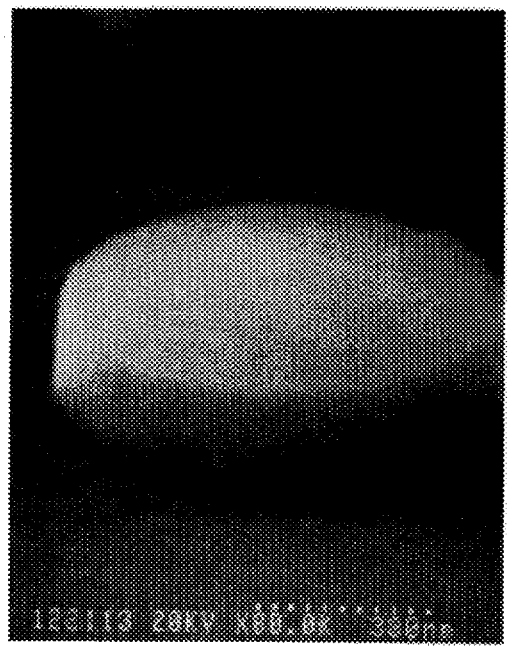
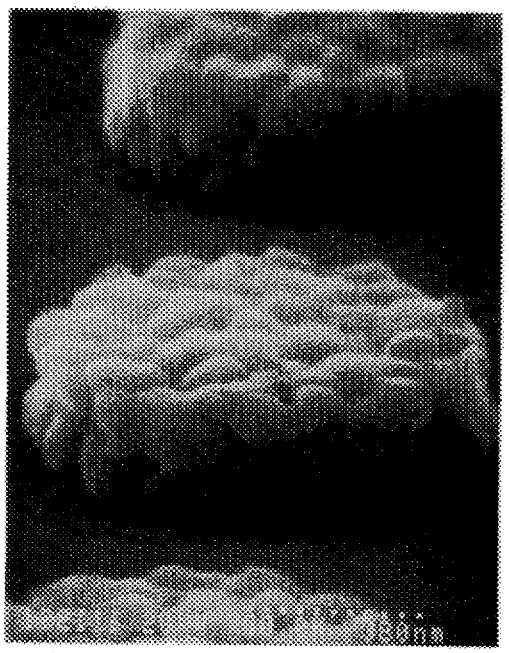

METHOD FOR FABRICATING POLYCRYSTALLINE SILICON HAVING MICRO ROUGHNESS ON THE SURFACE

This application is a divisional, of application Ser. No. 08/177,995, filed Jan. 6, 1994, which is a divisional of application Ser. No. 07/672,073, filed Mar. 9, 1991 now U.S. Pat. No. 5,366,917.

BACKGROUND OF THE INVENTION

The present invention relates to methods of fabricating semiconductor devices, and more particularly to fabrication methods of foxing polycrystalline silicon layers suitable for use as electrodes for capacitors.

In recent years, the memory cell size has been reduced accompanying the increase in the degree of integration of DRAMs, and along with it the area of storage capacitors used for the cells tends to be decreased. For this reason, stacked capacitors or trench stacked capacitors that have a large effective area for the capacitor part, an excellent α-ray resistance characteristic and a small interference between the capacitor parts have been employed in order to secure sufficiently high capacitances. However, for 64 Mbit DRAMs now under development each cell area is anticipated to become smaller than 1.5 µm$^2$, so at there is required a capacitor insulating film with a thickness of less an 50 Å when converted to equivalent thickness of silicon dioxide ($SiO_2$) film, even with the use of the aforementioned structures. It is extremely difficult to form such a thin capacitor insulating film uniformly and without defect all over the chip.

In order to resolve the above-mentioned problem, there is conceived an idea of increasing the effective areas of the opposing electrodes of a capacitor by providing unevenness on the surface thereof to obtain a larger electrostatic capacity for a capacitor of the same size. A method for increasing the opposed electrode areas, that is, for enlarging the effective surface areas, of polycrystalline silicon electrodes is disclosed in "Capacitance-Enhanced Stacked-Capacitor with Engraved Storage Electrode for Deep Submicron DRAMS," Solid State Devices and Materials, 1989, pp. 137–140. According to this method, the surface of a polycrystalline silicon is coated with spin-on-glass (SOG) containing photoresist particles. Then the effective surface area of the polycrystalline silicon film is increased by providing unevenness on the surface thereof by etching the SOG film, whereby etching the polycrystalline silicon surface using the resist particles as the mask.

However, this method has the following problems. Namely, there are required strict control of the size of the resist particles and distribution of the resist particles on the wafer with uniform density at the time of coating, in addition to the complexity of the process involved.

SUMMARY OF THE INVENTION

It is, therefore, an object of the present invention to provide a simple and mass-producible fabrication method of a semiconductor device having polycrystalline silicon layers having unevenness on their surfaces.

It is another object of the present invention to provide a fabrication method which enables controlling the size and/or the density of the unevenness on the surfaces of the polycrystalline silicon layers.

The fabrication method in accordance with the present invention includes a process of forming a first conductive layer at least the surface part thereof being constituted of polycrystalline silicon having a surface with unevenness caused by silicon grains, a process of forming a dielectric film on the surface with unevenness of the polycrystalline silicon and a process of forming a second conductive layer on the dielectric film.

In contrast to the method in the above-mentioned reference in which the unevenness is formed on the surface of a polycrystalline silicon layer by means of selective etching that uses the resist particles as the mask, unevenness on the surface of a polycrystalline silicon layer is formed based on the gain growth of silicon in this invention.

A polycrystalline silicon layer having a surface with unevenness can be formed based on the gain growth of silicon in accordance with the methods that follow. One of the methods is that when silicon is deposited on a substrate in accordance with an LPCVD method or the like, the deposition of silicon is carried out at the temperature (referred to as transition temperature) at which the crystal state of the deposited film makes transition from the amorphous phase to the polycrystalline phase. The other is one in which an amorphous silicon (a-Si) film is formed on a substrate in a vacuum or in an inert gas such as a nitrogen gas, then subjecting the sample to a heating (annealing) treatment at a temperature above the transition temperature again in a vacuum or in an inert gas such as a nitrogen gas.

In accordance with such methods it is possible to form a polycrystalline silicon film having a surface with unevenness by an exclusive use of a CVD method or the combination of a CVD method and annealing that are well-known techniques in the fabrication of semiconductors.

BRIEF DESCRIPTION OF THE DRAWINGS

The above and other objects, advantages and features of the present invention will be apparent from the following description taken in conjunction with the accompanying drawings, in which:

FIG. 13 shows photographs that illustrate the phenomenon described in FIG. 12, wherein FIG. 13(a) shows a cylindrical amorphous silicon film prior to annealing and FIG. 13(b) shows a cylindrical polycrystalline silicon film with unevenness taken after annealing;

DETAILED DESCRIPTION OF THE INVENTION

The polycrystalline silicon film having a surface with unevenness can be formed based on the grain growth of silicon when silicon is deposited at the transition temperature has already been mentioned. This phenomenon can be described as follows. Namely, during the deposition of silicon at the transition temperature, silicon deposited is principally of an amorphous type. If the temperature inside the furnace tube is kept at the transition temperature even after the completion of the deposition, silicon atoms that have been migrating in the surface of the deposited amorphous silicon film start to form crystalline nuclei. Silicon atoms that are migrating in the vicinity of the crystal nuclei are captured by the nuclei and contribute to the growth of the nuclei and to the increase of the size of the grains. As a result there is formed a polycrystalline silicon film having a surface with unevenness.

On the other hand, when silicon is deposited at a temperature below the transition temperature, the deposited film remains amorphous, with its surface being very smooth. When a film is deposited at a temperature above the transition temperature, it means the formation of an ordinary polycrystalline silicon film. The surface of the deposited polycrystalline silicon has too many nuclei, so that they can not grow and as a result, the surface remains smooth all the same.

As in the above, it is important to deposit silicon at the transition temperature. However, it is difficult to determine the transition temperature. This is because the transition temperature depends to some extent on the formation conditions. Nonetheless, the surface with unevenness can be obtained if silicon is deposited at a temperature in the range of the transition temperature of 550°±10° C. It should be noted, however, that the temperature of 550° C. is the temperature on the outside of the furnace tube and the actual temperature of the wafer at this time was found to be 590° C. as examined by an infrared sensor. Accordingly, if silicon is deposited at a wafer temperature in the range of 590°±10° C. (the temperature outside the furnace tube being in the range of 550°±10° C.), there can be formed a polycrystalline silicon film having a surface with unevenness. In the description that follows the temperature indicated will invariably refer to the wafer temperature, and the temperature outside the furnace tube will be indicated in parentheses following the wafer temperature.

Figures 1, 1A:
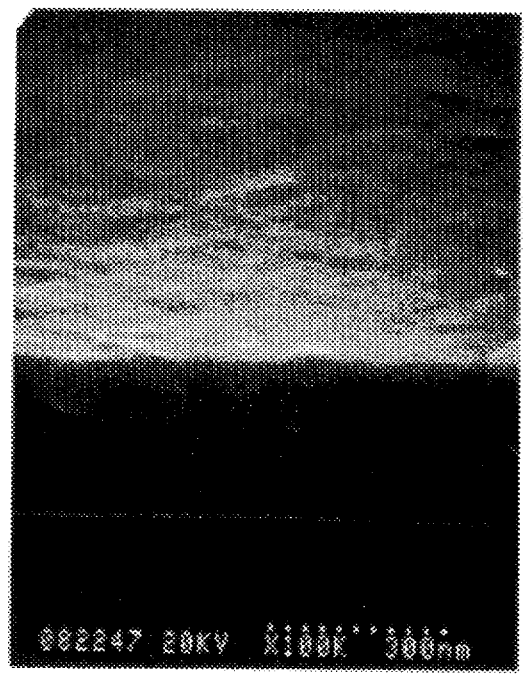
FIG. 1 shows scanning electron microphotographs and the corresponding reflection high energy electron diffraction (RHEED) photographs at the surface of the deposited film for different deposition temperatures.

Referring to FIG. 1, the surface condition and the crystallinity of the silicon films formed at various deposition temperatures are shown. The deposition was carried out by a low pressure chemical vapor deposition (LPCVD) method on a silicon substrate whose surface is covered with an $SiO_2$ film. The gas used is the mixture Of $SiH_4$ and He (at 20% of $SiH_4$ and 80% of He), and the pressure is 1 Torr. FIGS. 1AA, 1BA, 1CA, 1DA and 1EA are scanning electron microscopy (SEM) photographs, with a magnification of 100,000, of the surface of 2500 Å-thick silicon films deposited at the temperatures of 550° C. (510° C.), 580° C. (540° C.), 590° C. (550° C.), 600° C. (560° C.) and 650° C. (610° C.), respectively. The space between the adjacent dots among a group of dots shown at the bottom of the photographs is 30 nm, and hence the distance from one end dot to the other end dot of the arrayed 11 dots is 300 nm. The acceleration voltage of the electron micrograph is 20 kV. Further, FIGS. 1AB, 1BB, 1CB, 1DB and 1EB are RHEED photographs that show crystallinity corresponding to FIGS. 1AA, 1BA, 1CA, 1DA and 1EA, respectively.

As shown in FIG. 1AA, the surface of the silicon film deposited at 550° C. (510° C.) is very smooth, and no grain growth is observed. In addition, no ringlike patterns are visible in the RHEED photograph, FIG. 1AB, indicating that the film is amorphous. In the film deposited at 580° C. (540° C.) shown in FIG. 1BA, a partial growth of grains is observable, coexisting with the amorphous phase. Ringlike patterns appear in the RHEED photograph, FIG. 1EB, confirming a partial formation of crystals. When the deposition temperature is slightly raised to 590° C. (550° C.), hemispherical grains with a diameter in the range of 300 to 1700 Å, centered around 700 Å, are formed at high density, generating unevenness on the surface, drastically increasing the surface area of the film. In the RHEED photograph shown in FIG. 1CB there are observable ringlike patterns, showing the occurrence of crystallization. As the deposition temperature is further raised to 600° C. (560° C.) the surface unevenness becomes somewhat gentle as shown in FIG. 1DA. In the RHEED photograph shown in FIG. 1DB, dots of reflection electron diffraction become visible, indicating the formation of polycrystalline silicon with high orientation. When the deposition temperature is further raised to 650° C. (610° C.) which is close to the deposition temperature of the ordinary polycrystalline silicon used for LSIs or the like, the gain diameter becomes further increased with a smooth surface as shown in FIG. 1EA, and there are observed the dots of reflection electron diffraction with the formation of polycrystalline silicon as shown in FIG. 1EB.

As is clear from the above result, at the temperature (transition temperature) in the range where the crystal condition of the deposited silicon film makes a transition from the amorphous phase to the polycrystalline phase, a very fine roughness is generated on the film surface and the surface area is increased compared with other temperatures.

A silicon film which is grown at the transition temperature where the crystal condition changes from the amorphous phase to the crystalline phase is considered to lack compactness to some extent. This is estimated from the fact that the etching rate, for example, by a wet etching method, of a silicon film gown at the transition temperature is higher than that of a polycrystalline silicon film deposited at an ordinary deposition temperature (a temperature higher than the transition temperature).

When an extremely thin capacitor insulating film with a thickness of 50 Å is formed on the silicon film, there is a possibility of generating pin holes in the insulating film. In order to make a silicon film deposited at the above-mentioned temperature more compact, it only needs to be subjected to a heat treatment at a temperature higher than the transition temperature, for example, a temperature higher than 640° C. (600° C.). This heat treatment will not affect the unevenness in any substantial manner. Generation of pin holes can be prevented if a capacitor insulating film is formed subsequently. This heat treatment may be accomplished in the heat treatment for impurity doping. Further, instead of a heat treatment at a temperature above the transition temperature, a compact polycrystalline silicon film may be deposited on the above-mentioned silicon having unevenness to such an extent of thickness that will not fill in the unevenness. The compact polycrystalline silicon may be deposited at a temperature above 600° C. (560° C.). In accordance with the above-mentioned method it is possible to form a silicon film with a large surface area and small irregularity of characteristics by means of a simple fabrication process. By using such a silicon film as, for example, the electrode for the capacitor part of a semiconductor memory it becomes possible to increase the surface area, and hence the capacitance, of the capacitor for the same volume that is occupied by the capacitor part.

As has been mentioned above the transition temperature has a certain range. When a silicon film is deposited at a temperature on the lower side of the range of the transition temperature, the grain diameter becomes large because the density of generation points of silicon nuclei on the surface of amorphous silicon is low. When a silicon film is deposited at a temperature on the higher side of the transition temperature range, the gain diameter becomes small because the density of generation points of silicon nuclei on the surface of amorphous silicon is high. It is possible to control the size and the density of the grains by controlling the temperature within the range of the transition temperature as described above.

Moreover, the size and the density of grains can also be controlled by varying the growth pressure of the silicon film within the range of the transition temperature. This is because the generation of the silicon nuclei on the surface of amorphous silicon is suppressed due to the mixing of hydrogen into the silicon film if the silicon film is deposited at a low vacuum. Because of this, the grain size becomes large. On the other hand, if a silicon film is deposited at a high vacuum, the mixing of hydrogen into the silicon film is decreased and the density of nucleus generation on the surface of amorphous silicon becomes high. Because of this, the grain size becomes small. As in the above, the size and the density of the gains can be controlled by controlling the deposition pressure and the density of hydrogen for the silicon film within the range of transition temperature as described above. Further, even if the pressure is constant, it is possible to control the gain size and the grain density by changing the hydrogen concentration in amorphous silicon by varying the partial pressure of the material gazes.

Moreover, it was also found that it is possible to control the generation density of silicon nuclei on the surface of amorphous silicon by controlling the hydrogen concentration within the silicon film by adding hydrogen gas at the time of depositing the silicon film at the transition temperature.

Now, embodiments that employ the aforementioned methods will be described along with the effect of the present invention.

Embodiment 1

A stacked capacitor was manufactured. A thick $SiO_2$ film was formed on a silicon substrate, a silicon film was formed on top of it in accordance with the method illustrated in FIG. 1, and the product was used as the lower electrode of the capacitor. Phosphorus was diffused into the silicon film obtained under the conditions of 820° C. and 60 minutes, a capacitor insulating film was formed on the surface and a polycrystalline silicon film that is to become the upper electrode was formed on top of it. The formation of the capacitor insulating film was accomplished by first forming at $Si_3N_4$ film on the silicon film by an LPCVD method, then by oxidizing the surface of the $Si_3N_4$ film. The $Si_3N_4$ film was deposited in a thickness of 120 Å at a temperature of 780° C. and a pressure of 30 Pa using a mixed gas of $SiH_4$ and $NH_3$ (with $SiH_4/NH_3=1/100$), and the surface was oxidized at 900° C. by wet 1:1 pyrogenic oxidation to the extent where there is obtained a thickness of 20 Å when converted to equivalent oxide film, in the 120 Å of the $Si_3N_4$ film. Under the above-mentioned conditions the capacitor insulating film becomes 100 Å (labeled as deff) when converted to an equivalent $SiO_2$ film. If a smaller thickness of the capacitor insulating film, for example deff=50 Å, is desired, it is only needed to form an $Si_3N_4$ film of 60 Å and oxidize the film to the extent of an increase of 10 Å when converted to an oxide film. It is preferable that the thickness of the capacitor insulating film is in the range of 30 to 500 Å so as to enable the replication of the unevenness of the lower layer silicon film onto the upper surface of the capacitor insulating film. After the formation of a capacitor insulating film of deff=100 Å then a polycrystalline silicon film is deposited on top of it at 640° C. (600° C.) and phosphorus was diffused into it. Following that, stacked capacitors were obtained by dividing the sample into the dimensions of 1 mm×1 mm by means of a lithography technique and a dry etching technique.

Figures 1, 1A, 2:
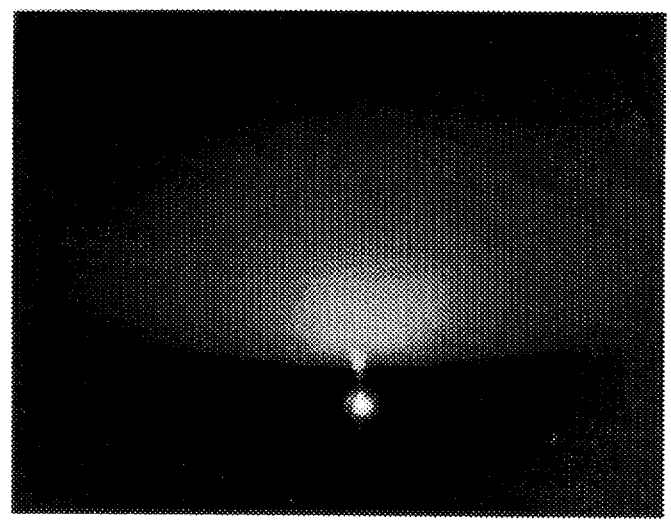
FIG. 2 is a graph showing the dependence of the capacitance of fabricated capacitors, the surface area of the silicon film and the deposition temperature of silicon.
Figures 1, 1B:
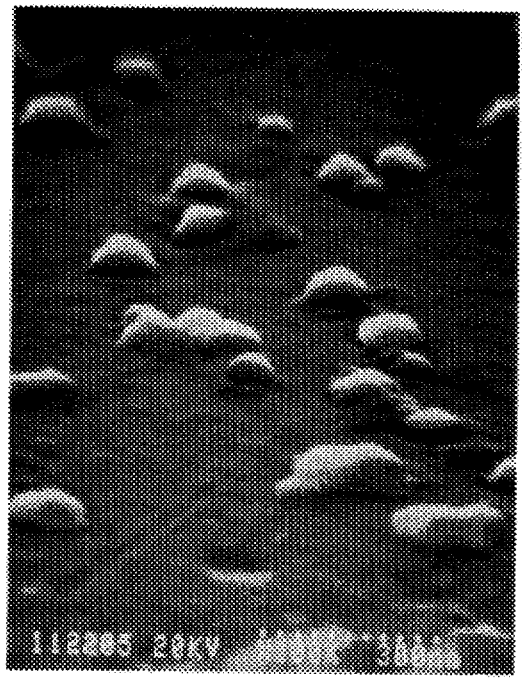
Figures 1, 1B, 2:
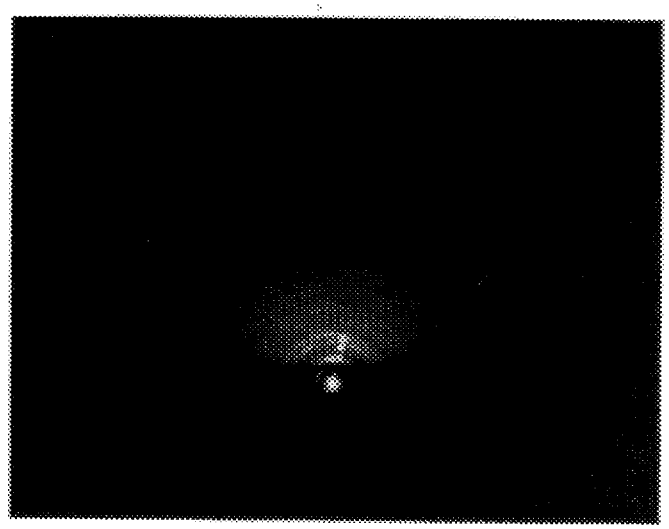

As a result, the dependence of the surface area and the capacitance of the silicon film on the deposition temperature of the lower silicon film as shown in FIG. 2 were obtained. Namely, at the deposition temperature of FIG. 1A the surface area remains at 1 $mm^2$ and the capacitance is accordingly at a small value of 3.5 nF. For the deposition temperature of FIG. 1B the capacitance was slightly increased to 3.8 nF corresponding to a partial growth of the grain. For the deposition temperature of FIG. 1C both the surface area and the capacitance became more than twice the original values, namely, 2.1 $mm^2$ and 7.3 nF, respectively. For the deposition temperature of FIG. 1D a surface area of 1.07 $mm^2$ and a capacitance of 3.6 nF were obtained reflecting the gentleness of the surface roughness. For the deposition temperature of FIG. 1E the situation barely differs from that of FIG. 1A. Note that the results obtained at deposition temperatures other than those of FIG. 1 are also included in the figure. In either case, it is possible to obtain a capacitance that is more than twice as large that of an ordinary stacked capacitor with the same dimensions if a stacked capacitor uses a silicon film deposited at the transition temperature.

Figures 1, 1C:
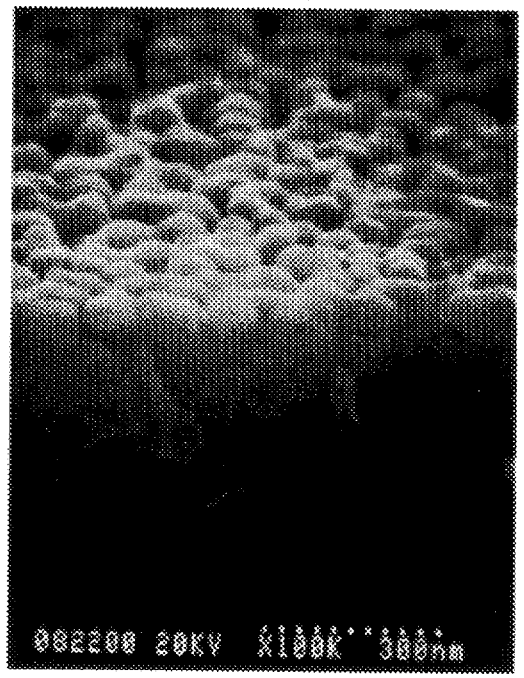
Figures 1, 1C, 2:
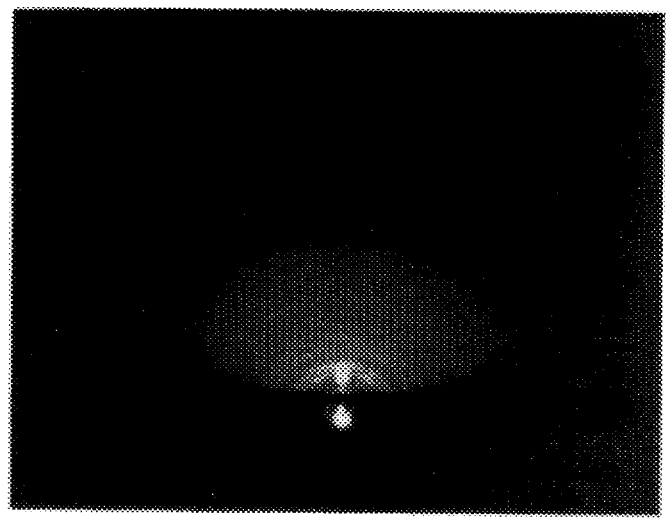
Figures 1, 1D:
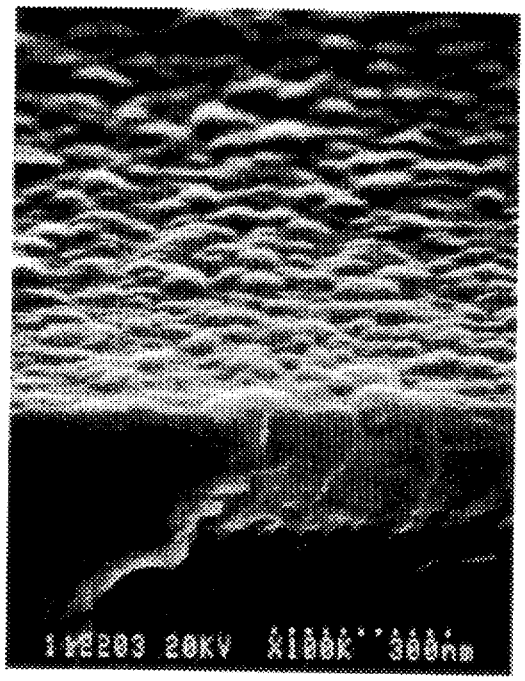
Figures 1, 1D, 2:
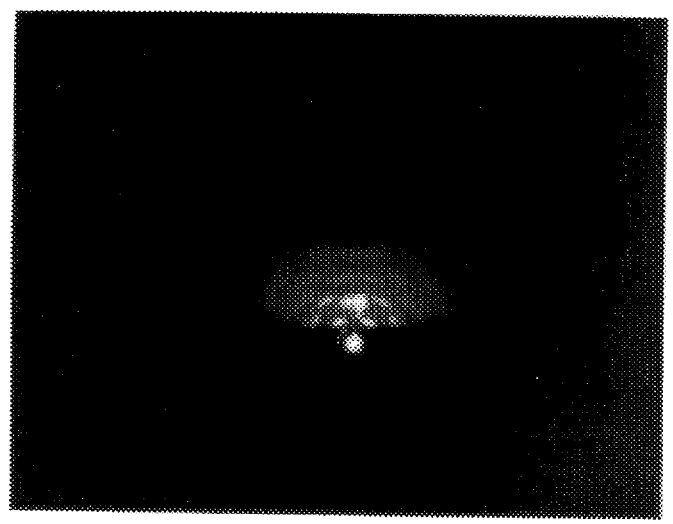
Figures 1, 1E:
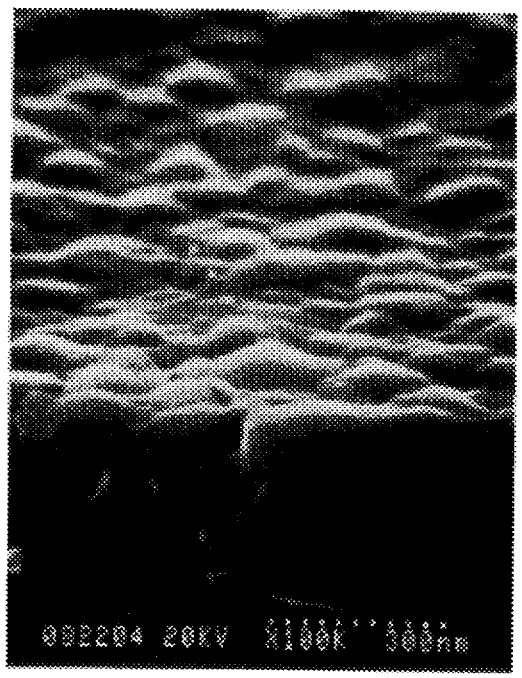
Figures 1, 1E, 2:
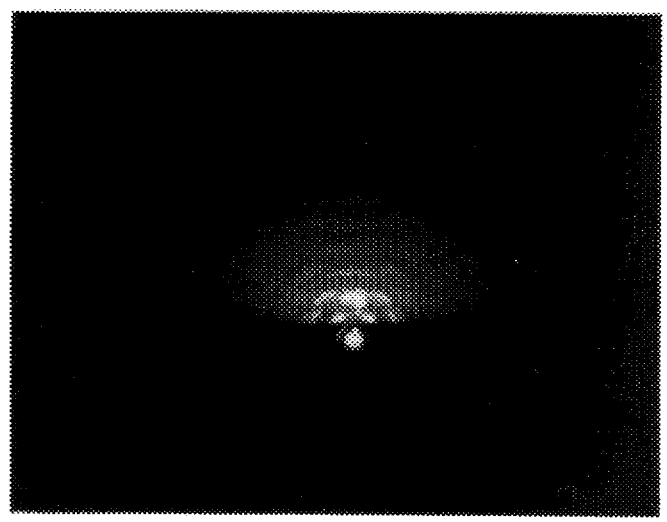
Figure 2:
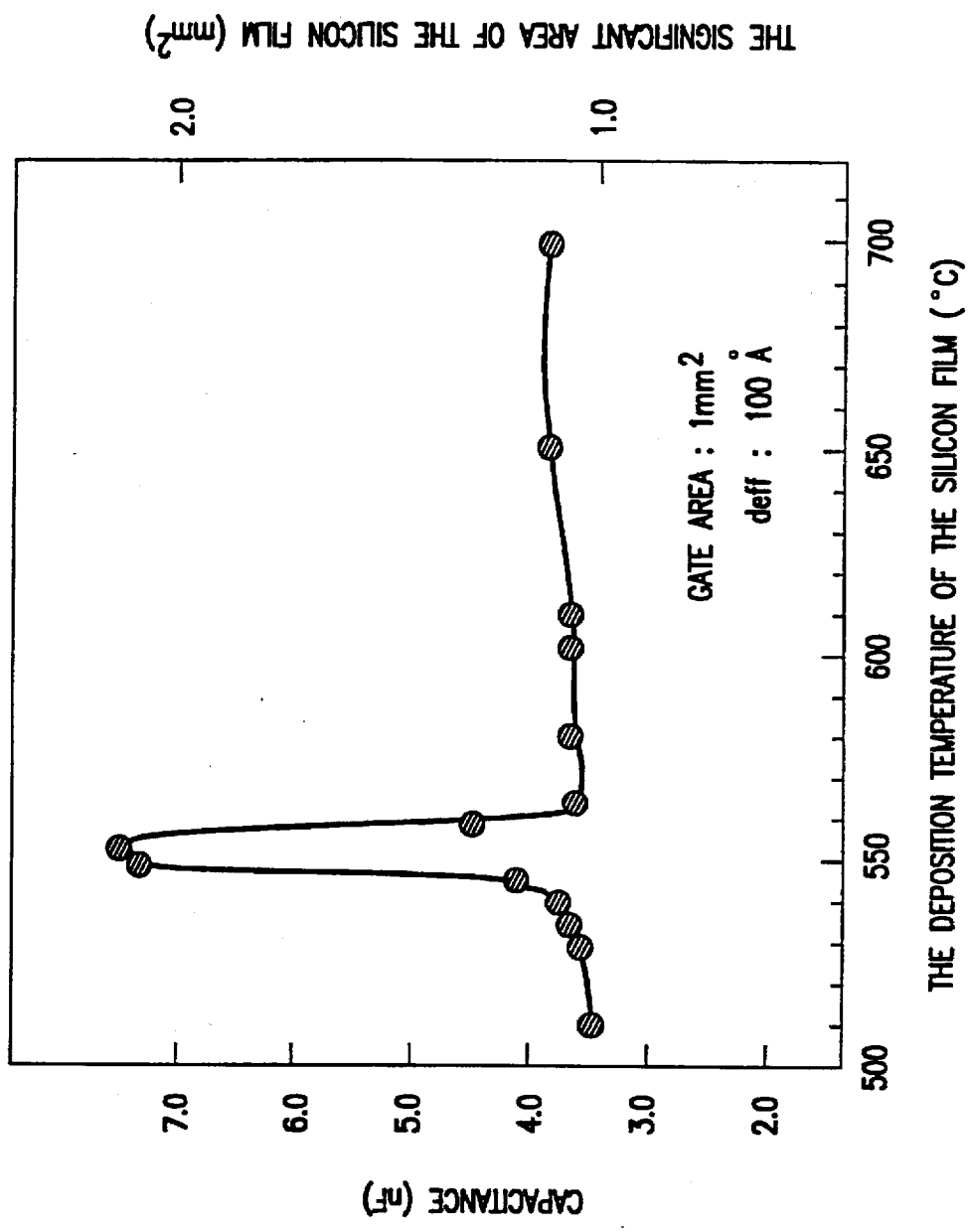
Figure 3:
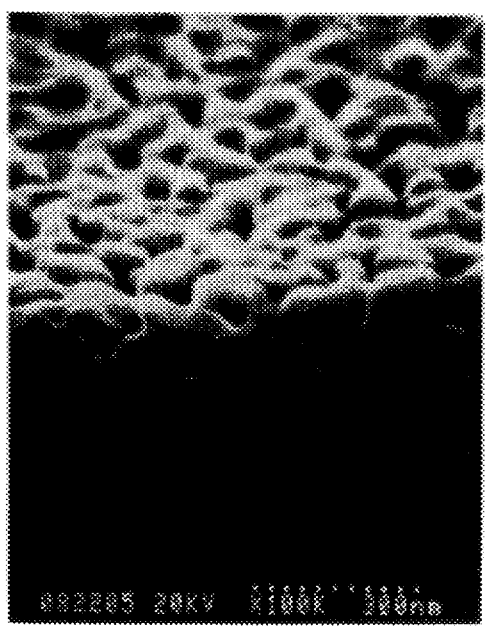
FIG. 3 is an electron microphotograph showing the surface condition of a silicon film with unevenness taken after phosphorus diffusion.

The surface condition of a silicon film with unevenness formed once on its surface will not be changed substantially by a heat treatment in the subsequent stage. A SEM photograph of the surface condition when phosphorus is diffused under the conditions of 820° C. and 60 minutes into the film deposited at 590° C. (550° C.) shown in FIG. 1C is shown in FIG. 3.

Figure 4:
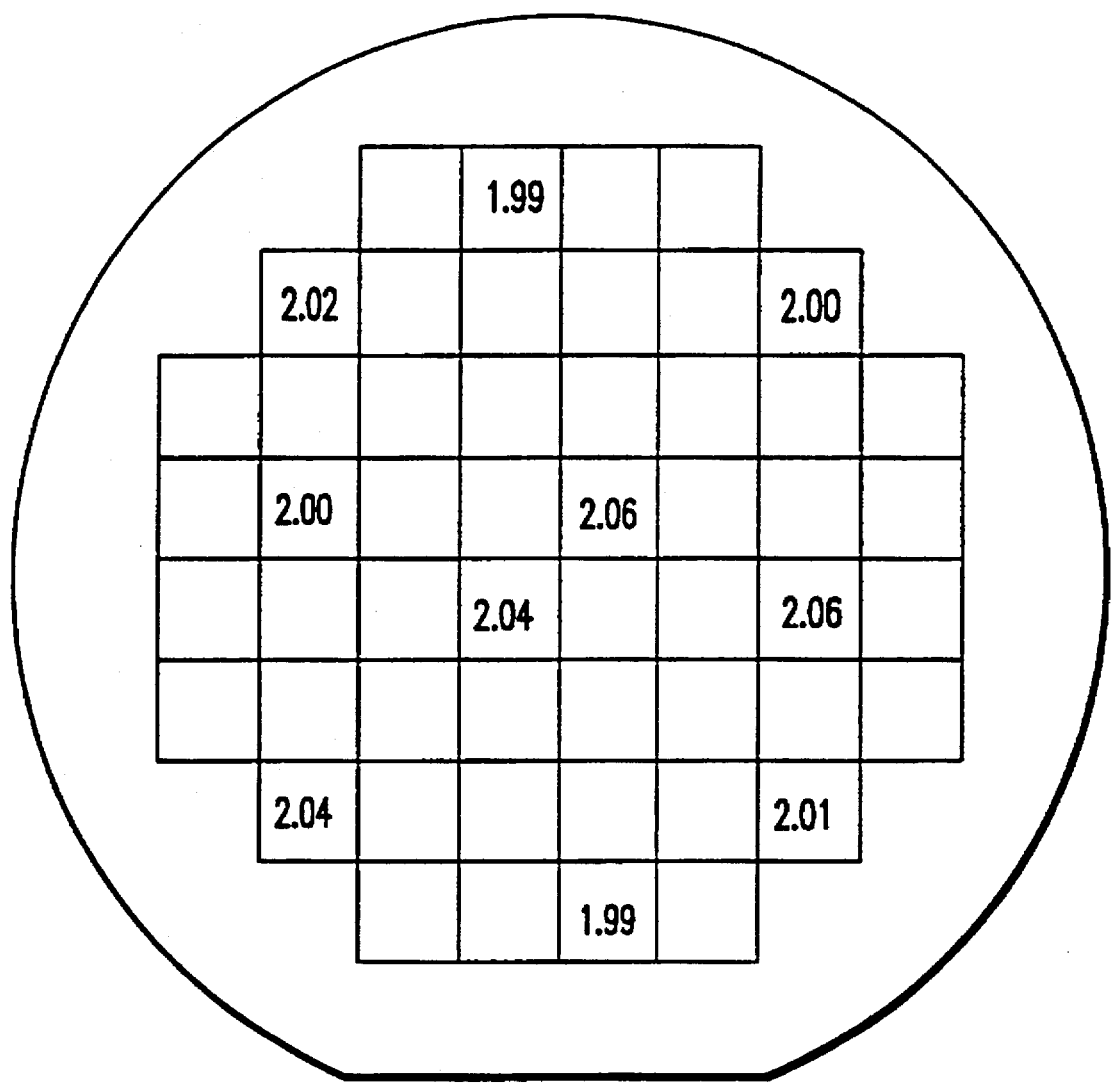
FIG. 4 shows a distribution diagram of the relative magnification at the surface area of silicon film deposited at the temperature of 590° C. within a 4-inch wafer.

FIG. 4 shows the surface area distribution (representative points only) within a four-inch wafer when phosphorus was diffused into the silicon film formed at 590° C. (550° C.). The measurement was taken using the stacked capacitor of Embodiment 1. The numerical values which indicate the ratio of the surface area with respect to that of the wafer formed at 550° C. (510° C.) show that the surface area increase is very uniform all over the wafer surface. In addition, its reproducibility was also found to be satisfactory. This uniformity prevails also between wafers and between lots, and the reproducibility is also high.

Figure 5:
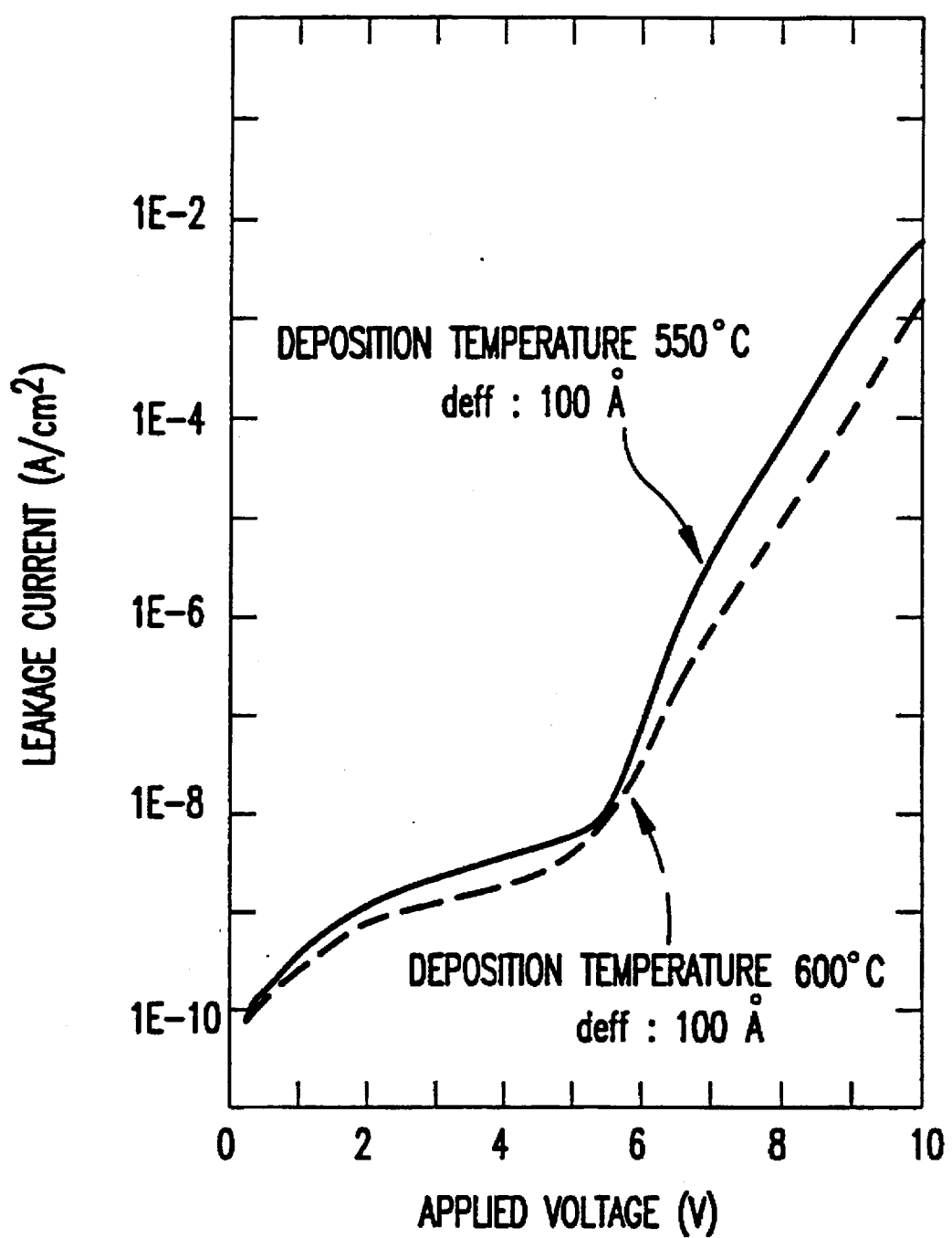
FIG. 5 is a graph showing the dependence of the leakage current on the applied voltage for the stacked capacitors formed at different silicon film deposition temperatures (590° and 640° C.)

In FIG. 5 is shown the leakage current characteristic of the stacked capacitors obtained at the deposition temperatures of 590° C. (550° C.) and 640° C. (600° C.). It can be seen that the result for the former case is somewhat inferior to the latter case. However, in the use for semiconductor memories the maximum voltage applied to a capacitor is 5 V (lately, 3.3 V). Therefore, there arises substantially no problem since there exists hardly any difference in the leakage current between the two cases up to the voltage of 5 V, and the applied voltage can be reduced to one half by the use of the well-known ½ Vcc cell plate technique.

Here, the leakage current characteristic will be compared when the same capacity is secured. For the construction of a 64 Mbit DRAM with the ordinary stacked capacitor structure it is said that a capacitor insulating film of about 50 Å thickness when converted to equivalent oxide film (deff) is required if a polycrystalline silicon film deposited at the conventional temperature of about 640° C. (600° C.) is used as a storage electrode. However, by employing a silicon film in accordance with the present invention it becomes possible to use a capacitor insulating film with thickness of 100 Å.

Figure 6:
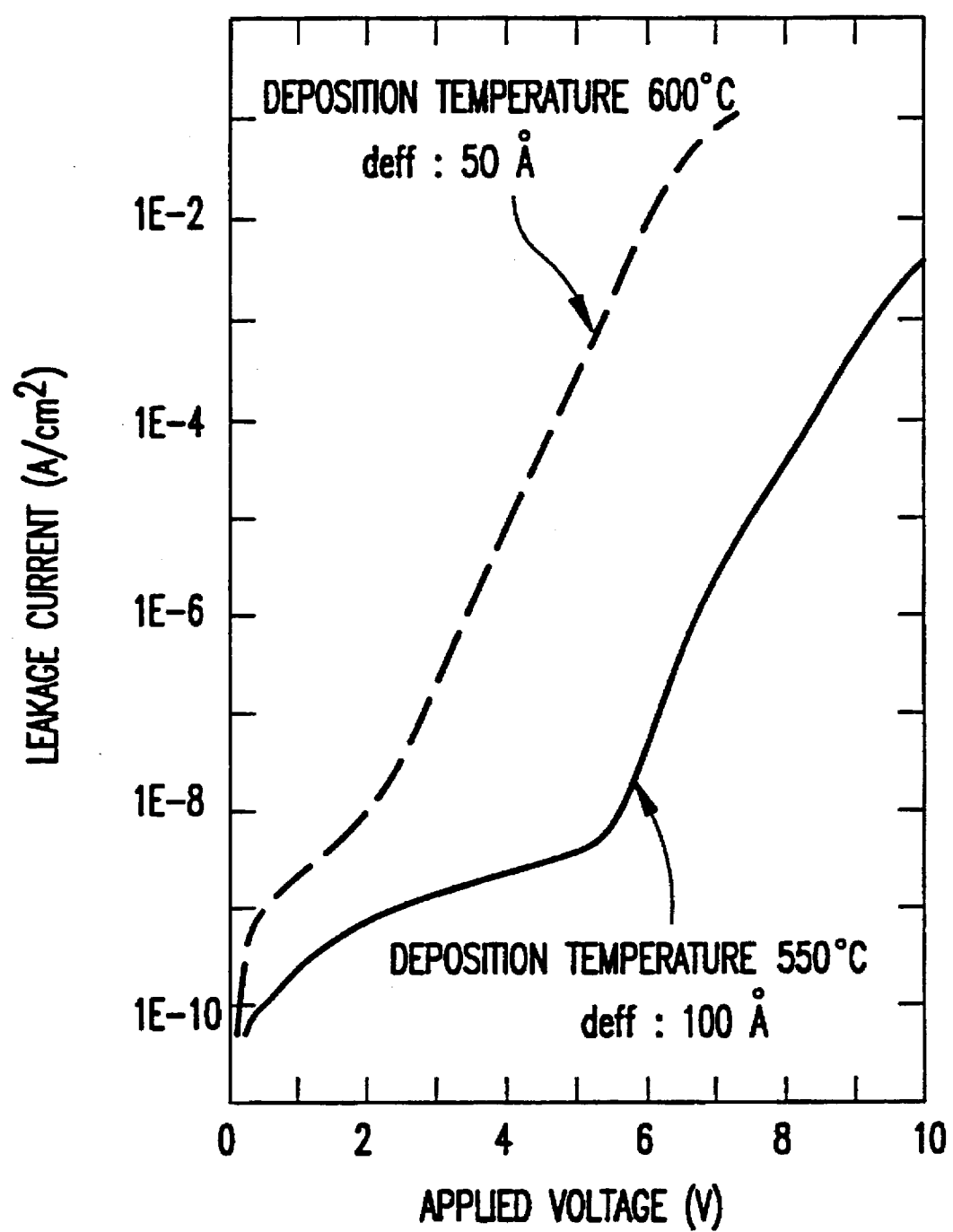
FIG. 6 is a graph showing the dependence of the leakage current at the applied voltage for stacked capacitors with different silicon film deposition temperatures.

In FIG. 6 is shown the leakage current characteristic for two representative cases. As can be seen from the figure, the voltage by which the leakage current can be suppressed to below $1 \times 10^{-8}$ A/cm$^2$ where a capacitor is usable as a device is 2.0 V for the conventional capacitor. In contrast, the corresponding voltage can be increased to 5.4 V in the case of using silicon of the present embodiment, sharply improving the leakage current characteristic.

Figure 7A:
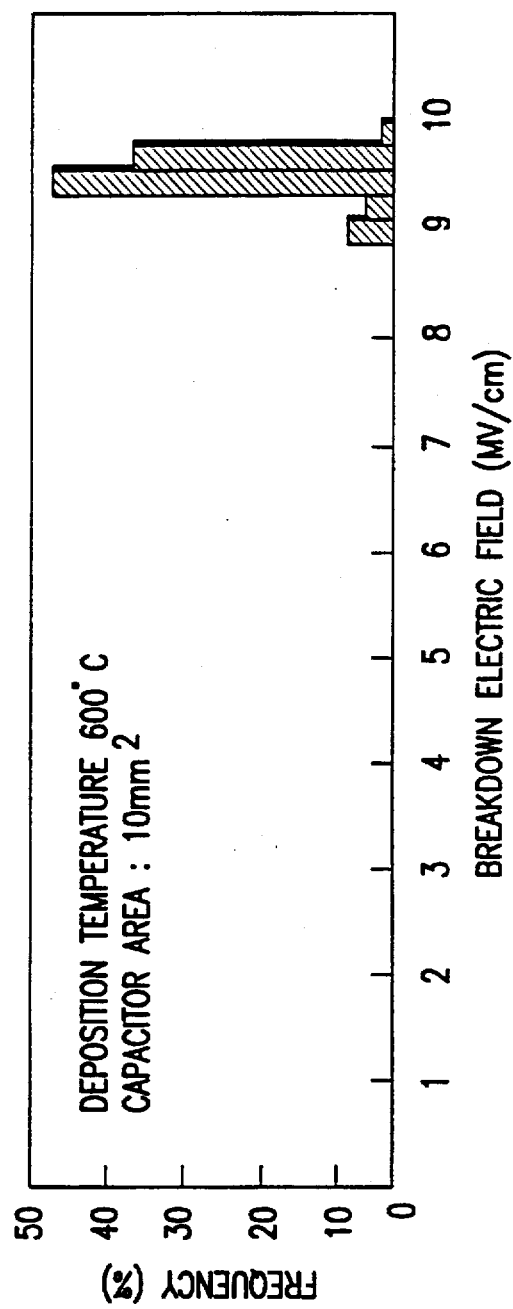
FIG. 7 is a frequency distribution diagram for the breakdown voltage of stacked capacitors for different silicon electrode deposition temperatures.
Figure 7B:
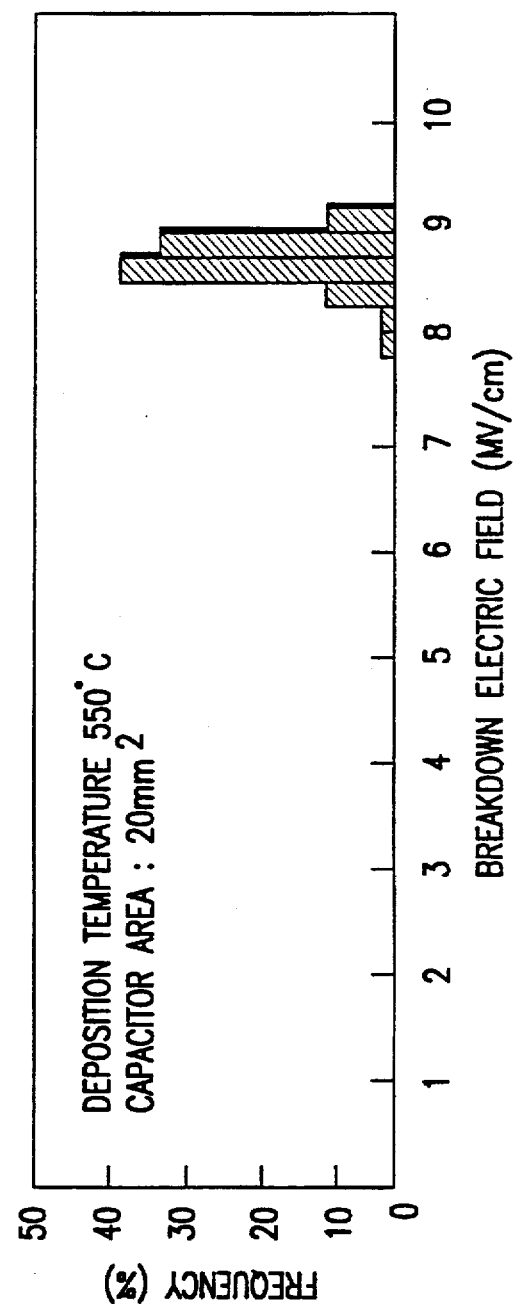

In FIG. 7 is shown the breakdown voltage distribution for the same cases of deposition at 590° C. (550° C.) and 640° C. (600° C.) that are given in the lower and upper portions of the figure, respectively. The results shown correspond to the measurement results taken by using stacked capacitors with the same structure as in Embodiment 1 for several sheets of wafer. The thickness of the capacitor insulating film at this time was 100 Å. The peak value of the breakdown electric field intensity for the case of Si electrode deposition temperature at 590° C. (550° C.) is 8.7 MV/cm while the peak value for the case of 640° C. (600° C.) is 9.5 MV/cm so that the deterioration of the former case is 0.8 MV/cm relative to the latter. However, in that actual use such a difference is of no particular concern. Moreover, the scatter of the breakdown electric field intensity value is comparable for both samples, and is very satisfactory.

Embodiment 2

Figure 8:
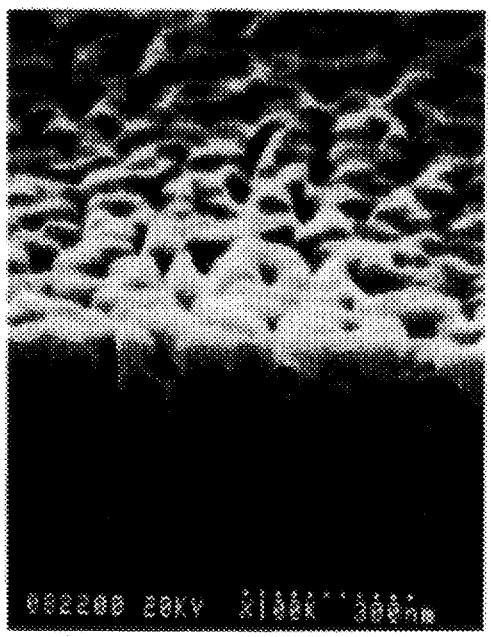
FIG. 8 is a scanning electron microphotograph of the film surface according to embodiment 2 after annealing of a silicon film formed at the transition temperature.

The stacked capacitor used in the present embodiment was manufactured in the same way as in Embodiment 1. Embodiment 1 the quality of the silicon film deposited at the transition temperature was made compact by a heat treatment at the time of phosphorus diffusion. In the present embodiment, however, the film quality was made compact by subjecting the sample to an annealing at a temperature above the transition temperature prior to the formation of the capacitor insulating film. In FIG. 8 is shown a SEM photograph of the surface of a silicon film deposited at the transition temperature of 590° C. (550° C.), then annealed at 740° C. (700 ° C.) in a nitrogen atmosphere. There is little change in the surface condition from that at the time of the film deposition. Subsequently, phosphorus was diffused similar to Embodiment 1, a capacitor insulating film was formed, a polycrystalline silicon film that is to become the upper electrode was deposited to form a stacked capacitor similar to that of Embodiment 1. Capacitance and surface area of a capacitor same as those of Embodiment 1 were obtained. They are extremely uniform within the wafer, from one wafer to another and from one lot to another as in Embodiment 1, with satisfactory reproducibility. As to the leakage current characteristic and the breakdown voltage, the result obtained was satisfactory, being substantially the same as at the deposition temperature of 640° C. (600° C.).

Now, it is to be noted that the annealing was carried out at 740° C. (700 ° C.) in the present embodiment, but the compactness of the silicon film may be accomplished by an annealing for a long time at a low temperature such as 650° C. (610° C.) or by an annealing at a high temperature of 840° C. (800° C.).

Embodiment 3

Figure 9:
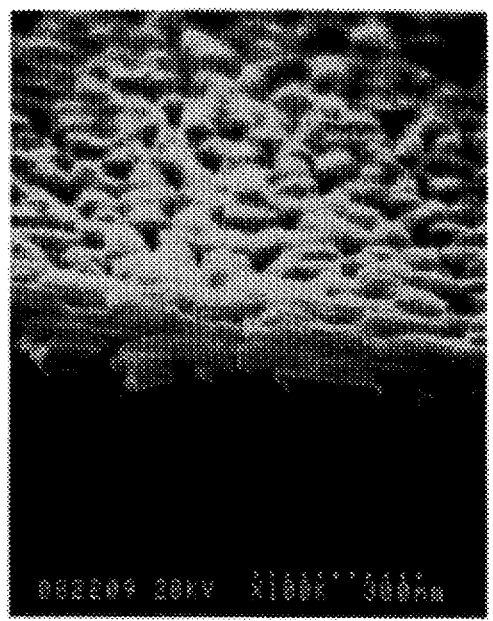
FIG. 9 is a scanning electron microphotograph showing the surface condition according to embodiment 3 of a film formed by depositing a compact polycrystalline film at a temperature above the transition temperature, on a silicon film formed at the transition temperature.

In the present embodiment, instead of the annealing in Embodiment 2, a compact silicon film was deposited at a temperature above the transition temperature on a silicon film formed at the transition temperature. Here, a polycrystalline silicon film was deposited to a thickness of 300 Å at the temperature normally used. FIG. 9 is a SEM photograph showing the surface condition of the surface after the deposition. There is observed little change in the surface condition.

Following the above, a stacked capacitor was formed in the same way as in Embodiment 2, and the capacitance and the surface area of the capacitor formed were measured. The result is similar to that of Embodiment 1, the value distribution within the wafer, between wafers and between lots was extremely uniform, and its reproducibility was excellent. Further, the leakage current characteristic and the breakdown voltage were satisfactory, being substantially the same as those for the deposition temperature of 640° C. (600° C.).

It is to be noted that it is necessary to limit the thickness of the silicon film to a degree which will not bury the micro roughness on the surface of the underlying silicon film.

Embodiment 4

In the present embodiment, a stacked capacitor having a capacitor part also on the sides faces will be described.

Figure 10A:
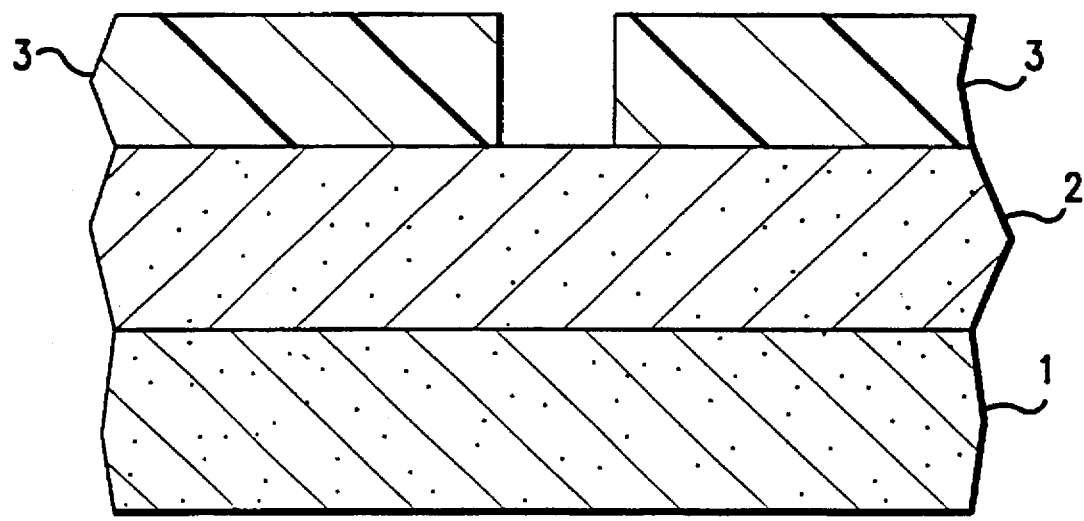
FIG. 10 shows sectional views for different fabrication processes of a stacked capacitor having unevenness also on the side faces according to embodiment 4.
Figure 10B:
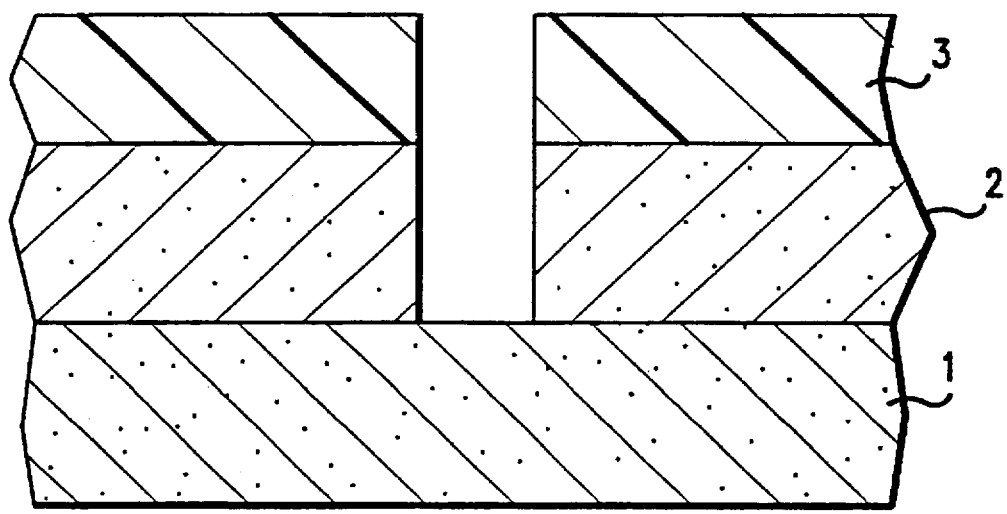
Figure 10C:
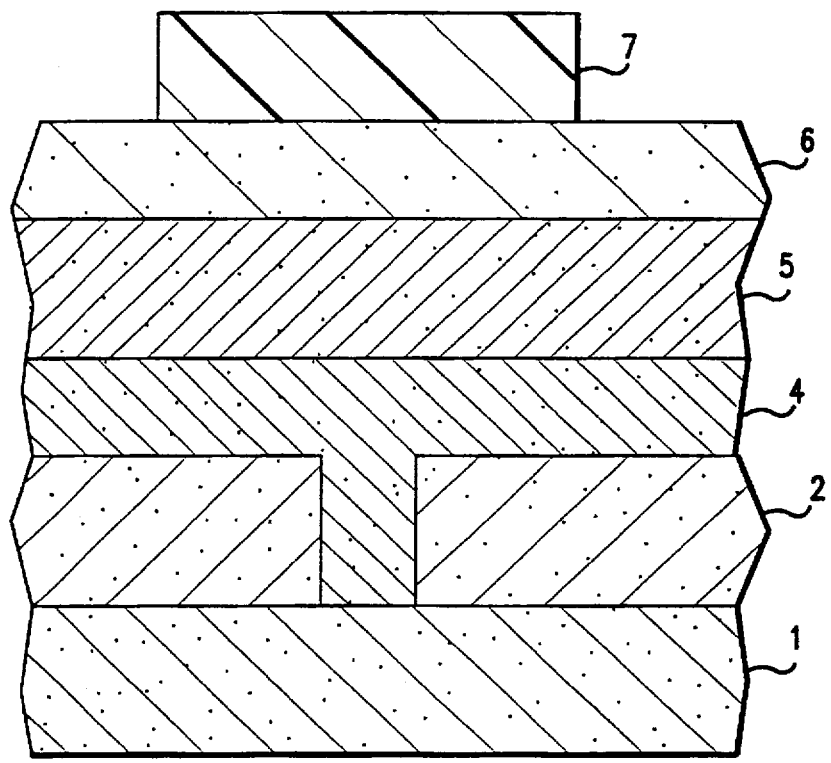
Figure 10D:
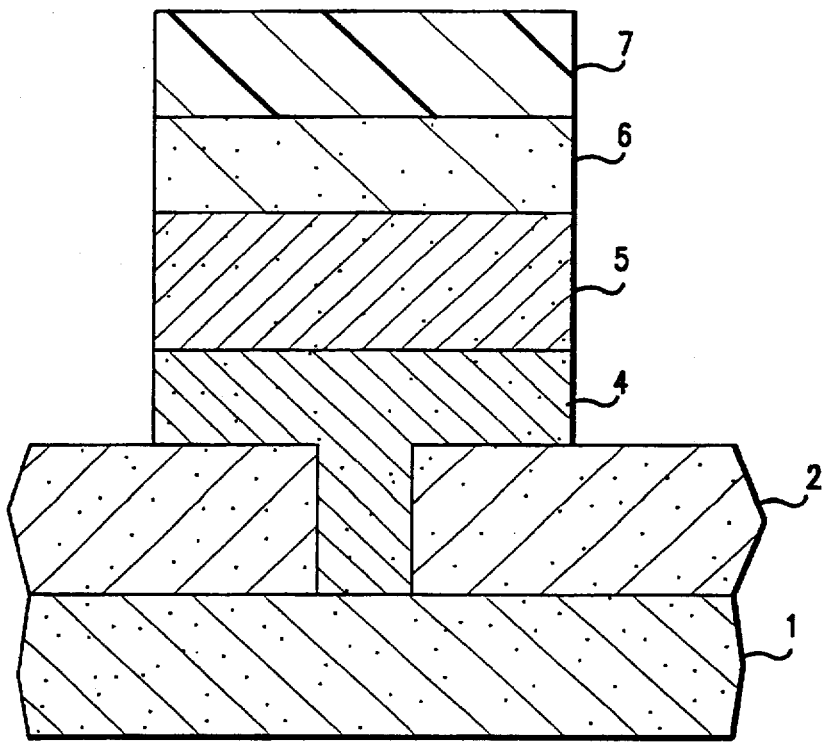
Figure 10E:
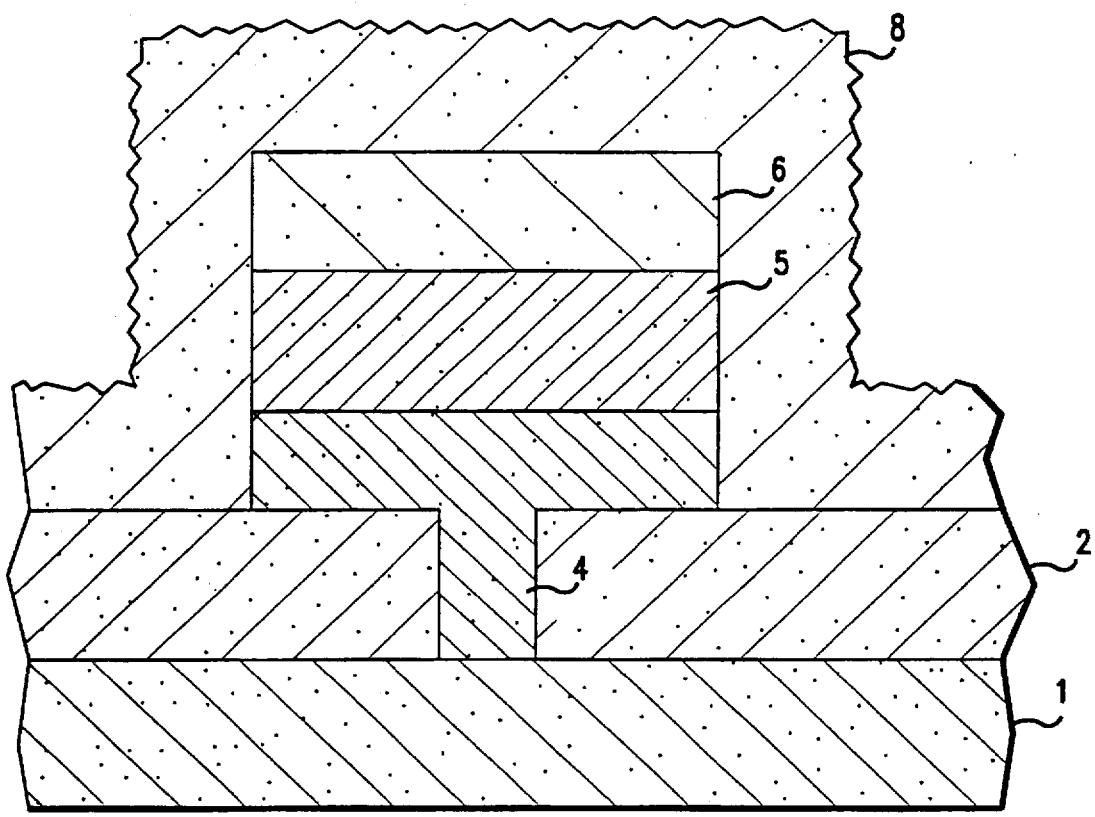

First, as shown in FIG. 10a, a silicon oxide film 2 is formed on a silicon substrate i with a transfer gate and the like formed thereon, resist 3 is applied to be patterned and the oxide film 2 is etched by dr etching (FIG. 10b). Then, as shown in FIG. 10c, a polycrystalline silicon film 4 is deposited, and an impurity such as phosphorus or arsenic is doped by thermal diffusion. The polycrystalline silicon film 4 is deposited by an LPCVD method under the normal conditions of the temperature of 640° C. (600° C.), a reaction gas which is a mixture of SiH$_4$ and He (at 20 vol % of SiH$_4$ and 80 vol % of He) and a pressure of 1 Torr. A silicon oxide film 5 is formed by a CVD method on the polycrystalline silicon film 4, and another polycrystalline silicon film 6 is formed on top of it under the same conditions as for the polycrystalline silicon film 4. A resist 7 is applied on top of it to be patterned (FIG. 10c), and by using the resist as a mask dry etching is carried out up to the polycrystalline silicon film 4 (FIG. 10d). Following the removal of the resist 7 a silicon film 8 having a, surface with unevenness is deposited at 595° C. (555° C.) (FIG. 10e). The deposition conditions are the same as for the polycrystalline silicon film 4 except for the temperature.

Figure 10F:
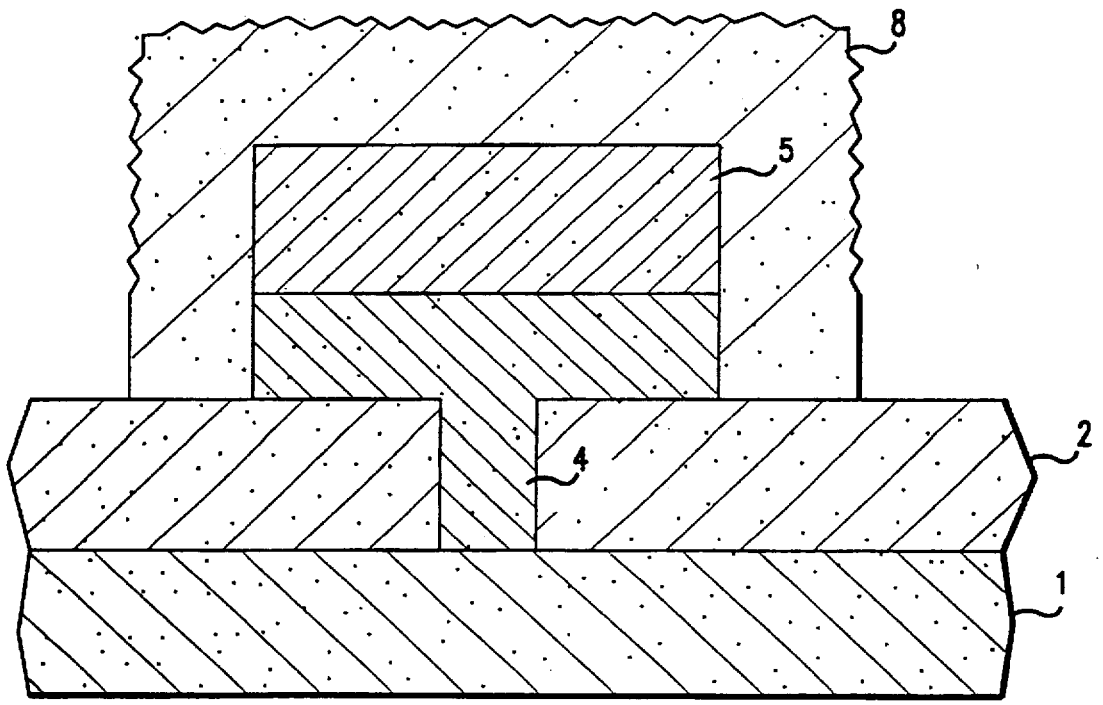

Then, the sample is annealed at 740° C. (700° C.) for 30 minutes in a nitrogen atmosphere. Next, phosphorus or arsenic is doped into the silicon film 8 by thermal diffusion. Subsequently, the sample is subjected to a reactive ion etching (RIE) that uses $Cl_2$ gas to obtain a lower electrode 8 for a stacked capacitor as shown in FIG. 10f. The top portion and the side faces of the silicon film 8 have even after the RIE unevenness with large area that reflects the unevenness before the etching of the silicon film B. In other words, the top portion and the side faces of the silicon film 8 are given unevenness by the replication of the roughness of the silicon film 8 onto the polycrystalline silicon film 6. Note that in the absence of the polycrystalline silicon film 6 the top portion of the stacked capacitor will be lost at the time of RIE and there will De left only its side faces.

Figure 10G:
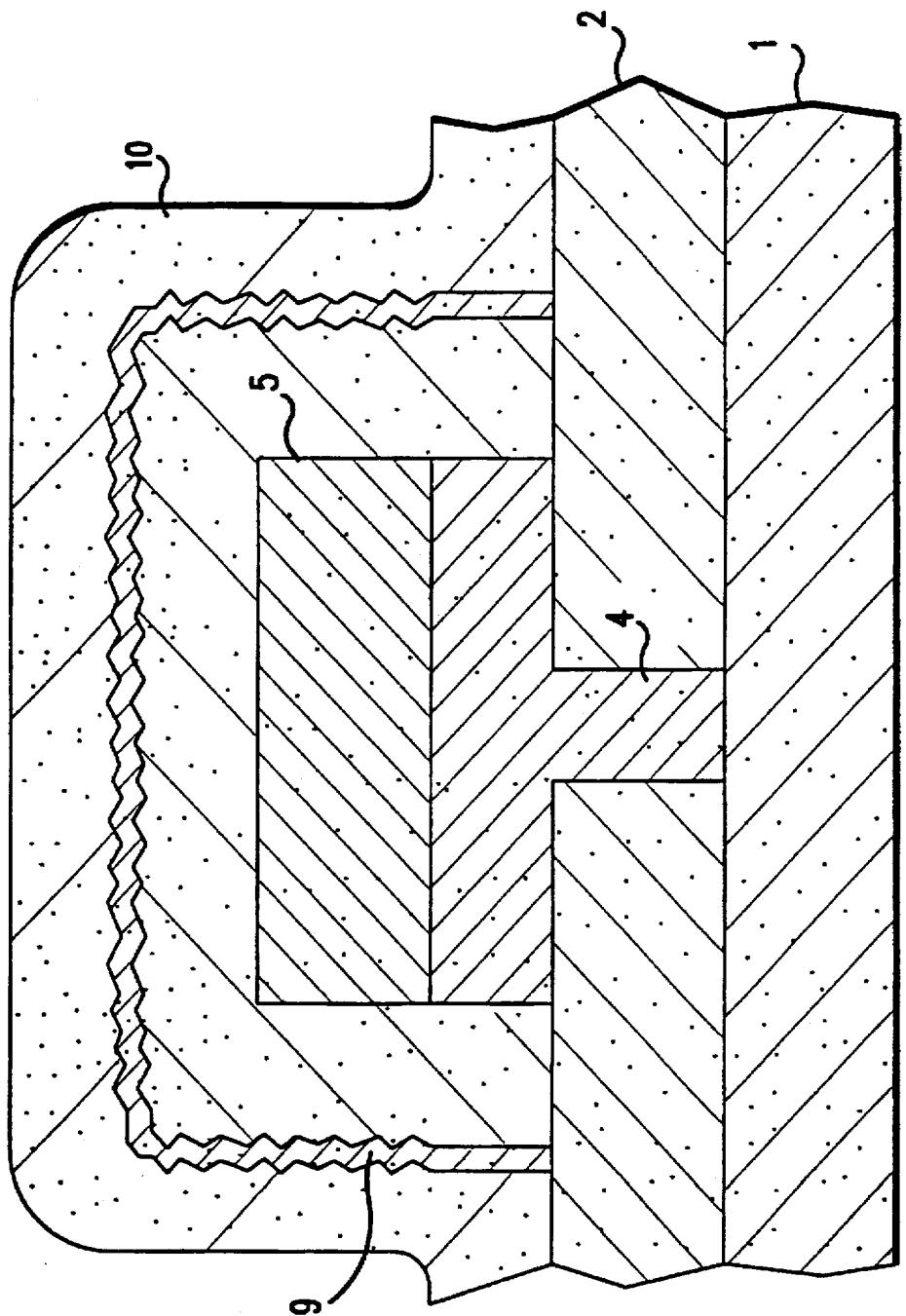

Next, a capacitor insulating film 9 is formed under the same conditions as for Embodiment 1. The formation of the capacitor insulating film was accomplished by first forming a $Si_3N_4$ film on the silicon film by an LPCVD method, then by oxidizing the surface of the $Si_3N_4$ film. The $Si_3N_4$ film was deposited to a thickness of 120 Å at a temperature of 780° C. and pressure of 30 Pa using a mixed gas of $SiH_4$ and $NH_3$ (with $SiH_4/NH_3=1/100$), and the surface was oxidized at 900° C. by wet 1:1 pyrogenic oxidation to the extent where there is obtained a thickness of 20 Å when converted to equivalent oxide film, in the 120 Å of the $Si_3N_4$ film. Further, a phosphorus-doped polycrystalline silicon film 10 is deposited (FIG. 10g).

Figure 11A:
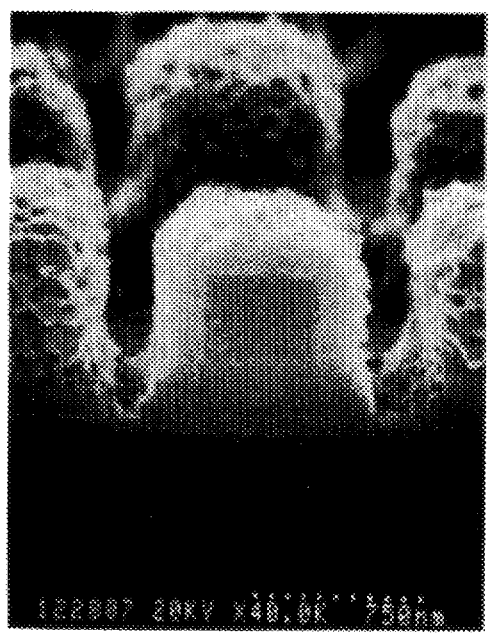
FIG. 11 shows scanning electron microphotographs of the cross-sections of a stacked capacitor formed in accordance with the fabrication method illustrated in FIG. 10.
Figure 11B:
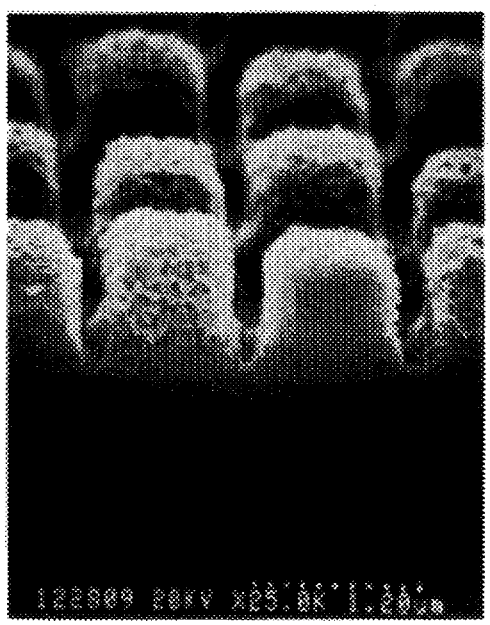

In this manner, a stacked capacitor that has capacitor parts formed also on the side faces and has a very large capacitance can be obtained. By increasing the thickness of the oxide film 5 it is possible to augment the area of the side faces and increase the capacitance accordingly. In FIGS. 11a and 11b are shown the SEM photographs of the stacked capacitor formed. The magnifications of FIGS. 11a and 11b are 40,000 and 25,000, respectively, showing approximately the same location of the capacitors. One of forefront capacitors is revealing in its cross section. From the figure it can he seen that there still remains a sufficiently well-defined unevenness on the surface of the silicon film even after the dry etching.

It should be mentioned here that phosphosilicate glass (PSG), borophosphosilicate glass (BPSG), an impurity-doped polycrystalline silicon film, a silicon nitride film, a laminated film of some of the foregoing, or the like may be employed in place of the oxide film 5. Further, in the present embodiment the silicon film 8 having unevenness in FIG. 10f was subjected as it is to an RIE. However, if there should be any apprehension about losing the unevenness on the side faces in the etching, it is possible to certainly protect the unevenness on the side faces by thinly covering the entire surface with an $SiO_2$ film by means of high temperature oxidation (HTO) CVD prior to subjecting the sample to the RIE. The $SiO_2$ film that remains on the side faces after the RIE needs only be removed by wet etching or a like method.

Further, in the present embodiment described above, the polycrystalline silicon film 6 formed at the temperature of 640° C. (600° C.) was used as a film for replicating the unevenness on the silicon film 8, but the film 6 may be replaced by a silicon film deposited at or below the transition temperature. Moreover, in Embodiments 1 to 4, thermal diffusion was employed invariably for the doping to the silicon film, but there may be used ion implantation or a method in which a dopant gas such as $PH_3$ or $AsH_3$ is included in the material gas at the time of deposition. Moreover, the dopant may be boron besides phosphorus and arsenic. Furthermore, in Embodiments 1 to 4, an example has been shown in which unevenness is formed all over the surface of the portions of the silicon films 6 and 8 that are to become a capacitor, but the capacitance will become larger than the case of the conventional flat polycrystalline silicon film even when the unevenness is formed even in a portion of the film.

Figure 12A:
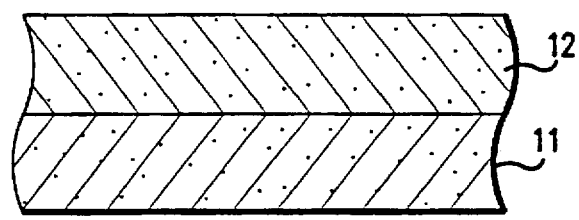
FIG. 12 shows sectional views for different growth stages in the phenomenon of the growth of a silicon layer having a surface with unevenness as a result of annealing an amorphous silicon layer on the surface at a temperature above the transition temperature.
Figure 12B:
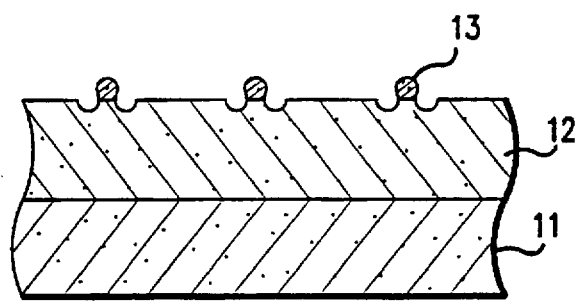
Figure 12C:
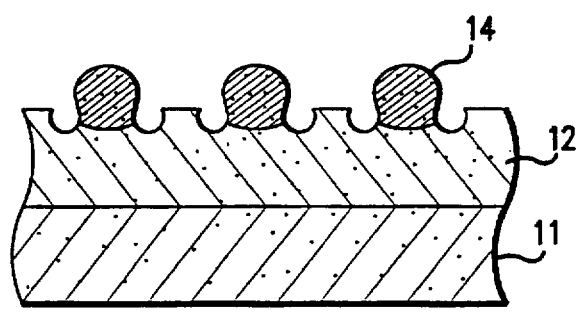
Figure 12D:
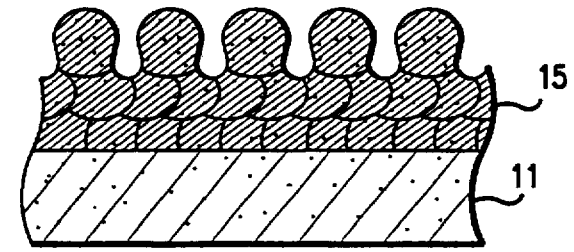

A silicon film having a surface with unevenness can also be formed by first forming an amorphous silicon layer on a substrate, then by annealing the amorphous silicon layer at a temperature above the transition temperature. This phenomenon will be described by reference to FIG. 12. First, a flat a-Si film 12 is deposited on a substrate such as a silicon substrate whose surface is covered with an $SiO_2$ film as shown in FIG. 12a. When the sample is annealed in a vacuum higher than $1 \times 10^{-6}$ Torr or in inert gas at a temperature above the transition temperature while maintaining the substrate surface clean, polycrystalline silicon nuclei 13 are formed on the surface as shown in FIG. 12b. The diffusion rate of silicon on the clean a-Si surface is extremely high compared with the growth rate of the a-Si solid phase, and silicon atoms are collected around the polycrystalline silicon nuclei formed on the surface by their diffusion in the surface, and the polycrystalline silicon nuclei 14 grow in a mushroom like shape or hemisphere like shape as shown in FIG. 12c. The growth of the nuclei 14 is continued. Finally as shown in FIG. 12d the nuclei become the gains 15 which have a hemisphere like shape.

The annealing temperature for the forming of the unevenness on the Si surface will not typically have any substantial influence provided that it is above the transition temperature. However, rapid heating at a high temperature such as 900° C. is not recommended. This is because under such an annealing, crystallization starts from not only the surface of the amorphous silicon film 12 but also the interior of it, making it impossible to grow the nuclei and obtain a substantial unevenness on the surface. It is necessary to grow polycrystalline silicon nuclei 13 first on the surface of the amorphous silicon film 12. For that purpose, it is preferable that the annealing occurs in the range of 580° to 750° C. However, it is possible to raise the temperature of annealing after the polycrystalline silicon grains 14 are grown once on the surface of the amorphous silicon layer 12. Accordingly, if annealing is carried out starting with an ordinary room temperature with a predetermined gradient of temperature rise as in the case of heating with lamp, it is possible to raise the temperature to a final temperature of 800° or 900° C., thereby decreasing the time for conversion to polycrystalline silicon.

Further, as is clear from the above description, it is possible to change the average size and the density of the gain projections formed from the surface of the amorphous silicon surface by changing the temperature of the heat treatment of the amorphous silicon film in a nonoxidizing atmosphere, such as in a vacuum, in an inert gas or nitrogen gas. As described in the above, for the growth of silicon gains from the surface of the amorphous silicon film it is first necessary to form nuclei which will act as the seeds for growing gains on the surface of the amorphous silicon film. The heating temperature substantially changes the density at which these nuclei are formed. When the heating temperature is high, this density becomes high, and the average size of the gain projections formed on the surface of the silicon film becomes small and the density of the projections becomes high. When the heating temperature is low, the density of nucleus generation is low. Because of this, the number of silicon atoms supplied to each of the nuclei at the time of gain growth becomes high compared with the heating at high temperature. Accordingly, in the case of heating at low temperature, each gain grows into large size, making the average diameter of the projections large and the density of the projections becomes small. Moreover, the average size and the density of the gain projections formed from the surface of the amorphous silicon film, at the time of forming unevenness through the formation of silicon nuclei from the surface of the amorphous silicon film, can also be changed by varying the rate of temperature rise in the vicinity of the temperature of silicon nuclei formation.

Moreover, the average size and the density of the grain projections formed from the surface of the amorphous silicon surface can also be changed by varying the hydrogen concentration within the amorphous silicon film instead of controlling the gain size by changing the heating temperature. Now, there exist many dangling bonds in the amorphous silicon film. These dangling bonds can be terminated by means of hydrogen atoms. At the time of formation of the nuclei on the surface of the amorphous silicon film, these hydrogen atoms drop off, bringing some of silicon atoms to stably bonded state. Accordingly, when hydrogen is added at high concentration, the generation density of the nuclei becomes low, each gain grows in large size, and the average diameter of the projections becomes large and the surface gain density becomes low. When the concentration of hydrogen addition is made low, the generation density of that nuclei becomes high, the average diameter of the gain projections becomes small and the density becomes high.

Further, it is also possible to form unevenness on the surface by adding conductive impurities such as phosphorus, arsenic, or boron to the amorphous silicon film. Namely, silicon atoms can also sufficiently freely migrate in the surface of the amorphous silicon film when impurities are added to the amorphous silicon film, and a phenomenon analogous to the case not adding impurities to the amorphous silicon layer can be induced.

As in the above, a polycrystalline silicon film having a surface with unevenness can also be formed by the aforementioned methods. However, it should be noted that unevenness cannot be formed on the surface even if the sample is subjected to an annealing when the surface of the amorphous silicon film 12 is covered with a native oxidized film or Impurities such as carbon atoms are attached to the surface. Consequently, when the film 12 is to be processed to a predetermined shape subsequent to the formation of the film 12, annealing has to be given following the formation of the surface of the amorphous silicon film after the processing, although there will be no problem if the formation of the amorphous silicon film 12 and the subsequent annealing are carried out in the same furnace tube.

In what follows embodiments that employ the method described above and their effect will be described.

Embodiment 5

An amorphous silicon film was formed using a molecular beam epitaxy (MBE) apparatus that is equipped with an electron gun type silicon evaporator with a volume of 40 CC. For the sample wafer, use was made of a 4-inch n-type silicon (100) substrate on which is formed a 2000 Å-thick $SiO_2$ film by thermal oxidation. After an RCA washing the sample water is transferred to the interior of a formation chamber, and a cleaning was carried out by heating it at 800° C. for one minute. After lowering the substrate temperature to room temperature, the sample was irradiated with a silicon molecular beam of 7 Å/s from the electron gun type silicon evaporator to form a 2000 Å-thick a-Si layer on the oxide film. The a-Si layer was converted to a polycrystalline silicon layer by heating the substrate in a vacuum higher than $1\times10^{-6}$ Torr, in an inert gas or in a $N_2$ gas with an impurity concentration equivalent to that degree of vacuum, by heating the substrate in the same vacuum chamber. Whether the polycrystallization was accomplished or not was judged by an in-situ observation by a RHEED technique. The substrate formed was taken out into the atmosphere, and it was evaluated by observing the cross section by means of the transmission electron microscopy (TEM).

Figure 14:
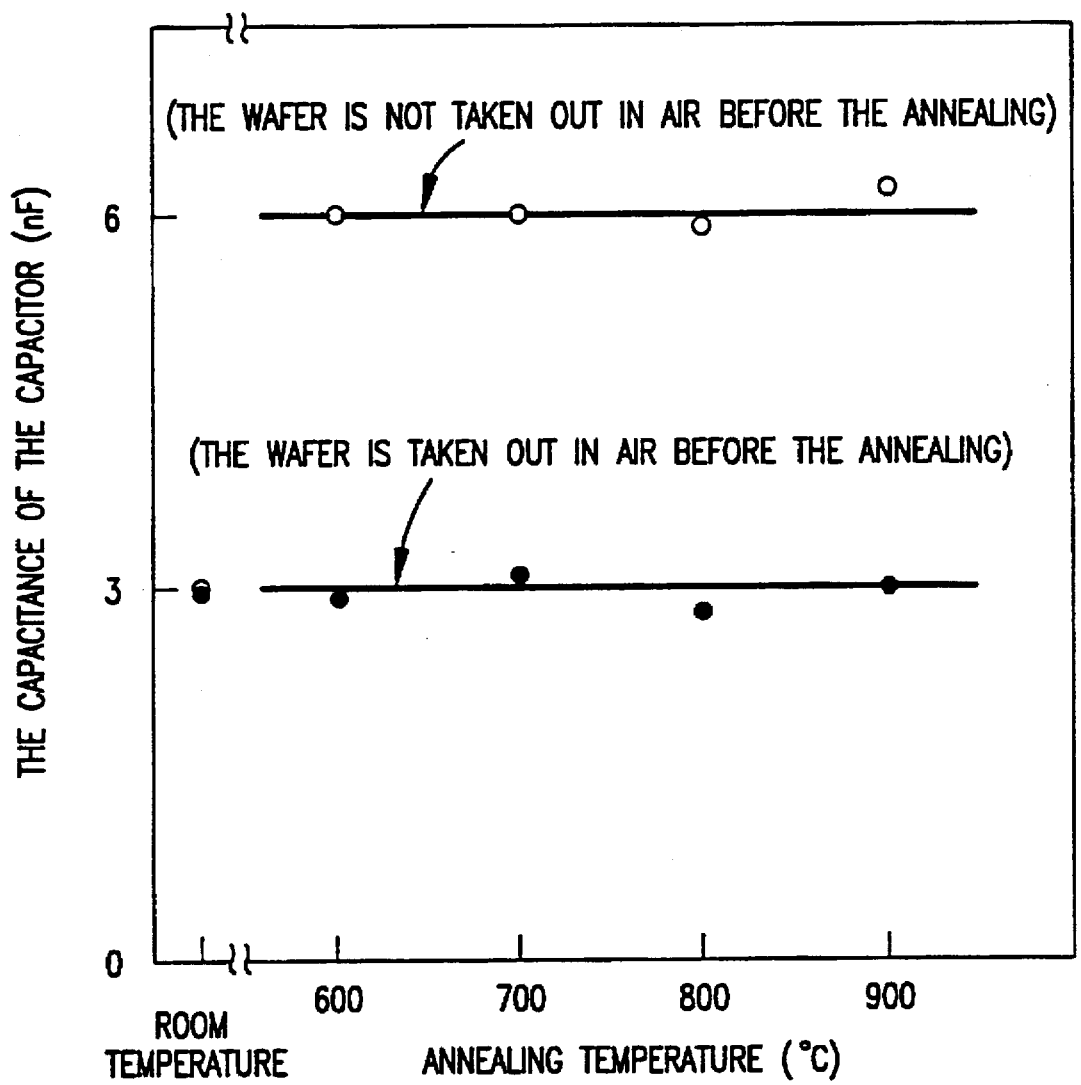
FIG. 14 is a graph showing the capacitance difference of a capacitor for the cases of taking, and not taking, the wafer out into the atmosphere prior to the annealing.

A lower electrode for a stacked capacitor was formed under the same conditions as in the present embodiment. Namely, a wafer with an a-Si layer formed on an $SiO_2$ film that covers a silicon substrate was taken out of an MBE apparatus, and was processed into a cylindrical form as shown in FIG. 13(a). The processed a-Si layer was covered with a spontaneously oxidized film and this oxidized film was removed, from the surface of the a-Si layer and its surface was cleaned; and the substrate was subjected to an annealing in an argon atmosphere. As a result, there was obtained a polycrystalline silicon film having a surface with unevenness as shown in FIG. 13(b). A capacitor was manufactured by forming a 100 Å-thick oxide film on the polycrystalline silicon film thus formed, and its capacitance was measured. FIG. 14 shows the dependence of the capacitance on the annealing temperature after the deposition of the a-Si film for the case of taking the sample out into the atmosphere before the annealing and the case of not doing so. As shown in FIG. 14, when the sample was not taken out into the atmosphere, a capacitance which is about twice as large as that of the case of taking it out into the atmosphere was obtained for a very wide range of annealing temperature, after the a-Si film was annealed. This indicates that by annealing the surface area became about twice as large due to the formation of a hemispherical unevenness on the surface. On the other hand, when the sample was taken out once into the atmosphere and an oxide film was formed on the a-Si film, the capacitance does not increase by annealing, remaining at substantially the same value as at immediately after the formation of the a-Si film. The a-Si film covered with an oxide film has a similar capacitance value to a polycrystalline silicon film which is used directly to form a lower electrode according to the conventional method. Although the annealing was carried out in an argon atmosphere in the present embodiment, it can be carried out in helium (He), in nitrogen ($N_2$) or in a vacuum of higher than $1\times10^{-6}$ Torr. In addition, the present embodiment can be applied to a silicon on sapphire (SOS) substrate or a silicon on insulator (SOI) substrate instead of to a silicon substrate. Moreover, in the present embodiment, the a-Si layer was formed in a MBE apparatus using an the a-Si electron gun type silicon evaporation device. Moreover, it is also noted that a phenomenon similar to the above occurs also in other methods of a-Si layer formation such as a gas source MBE method, an LPCVD method and a sputtering method provided that the a-Si layer surface is clean.

Embodiment 6

Figure 15A:
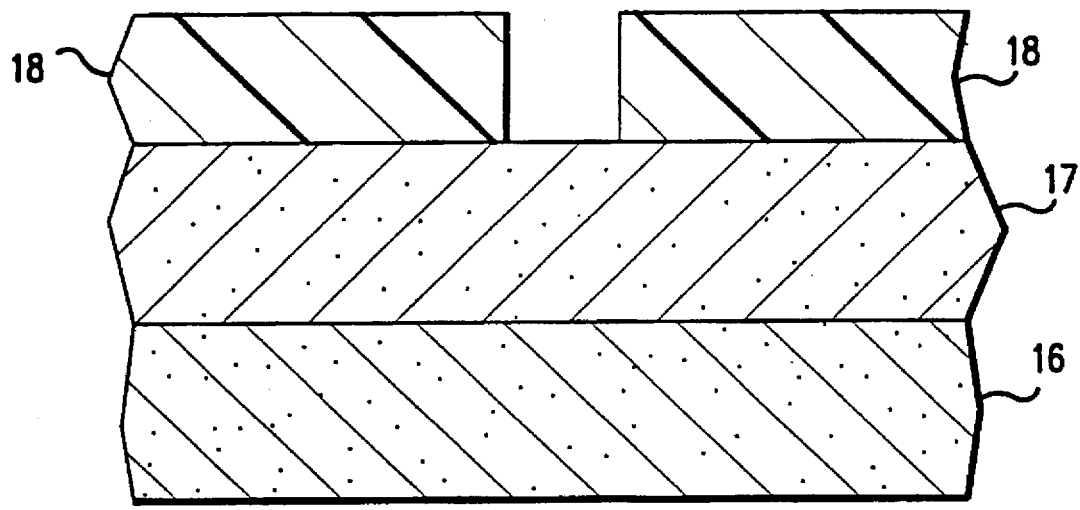
FIG. 15 shows sectional views for different fabrication processes according to embodiment 6 of the present invention.
Figure 15B:
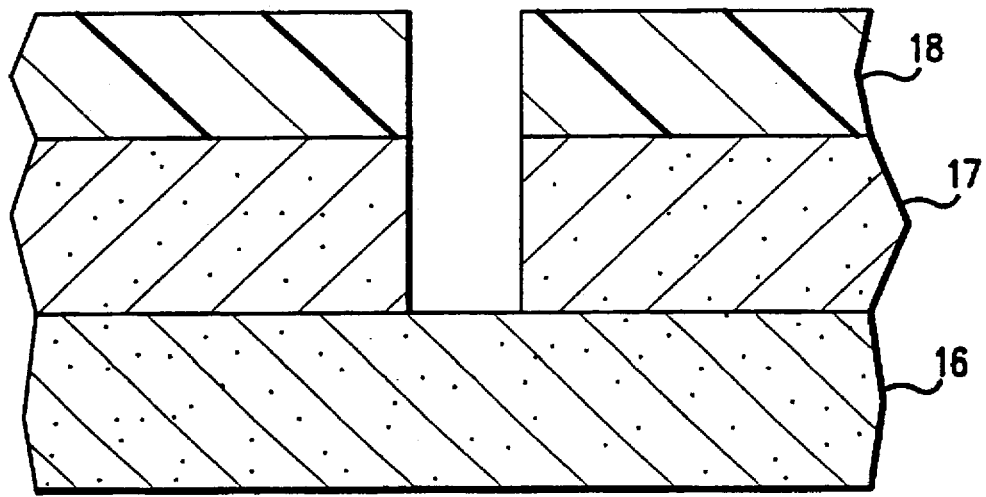
Figure 15C:
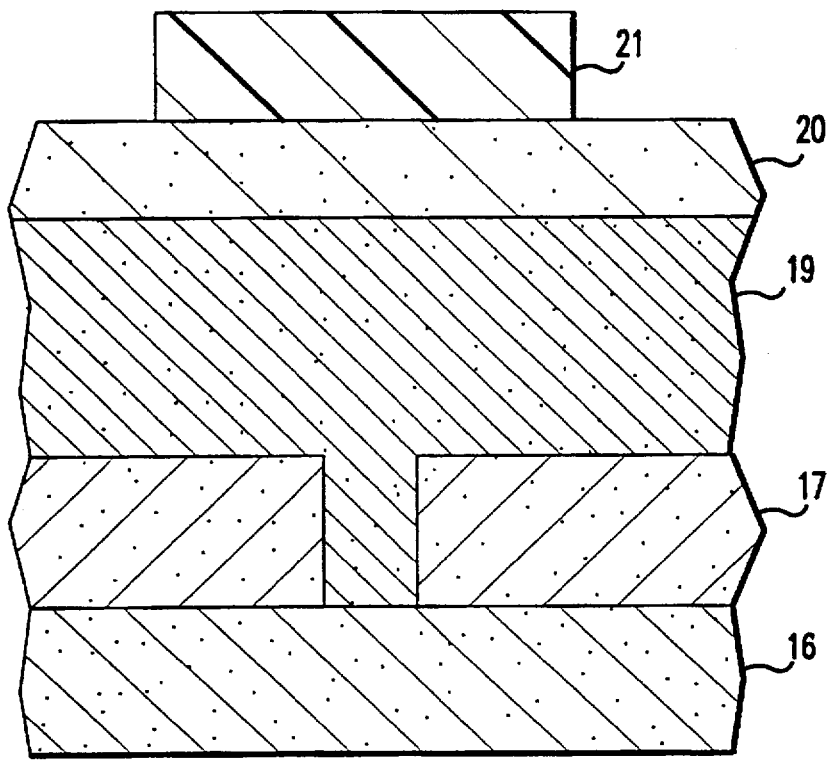
Figure 15D:
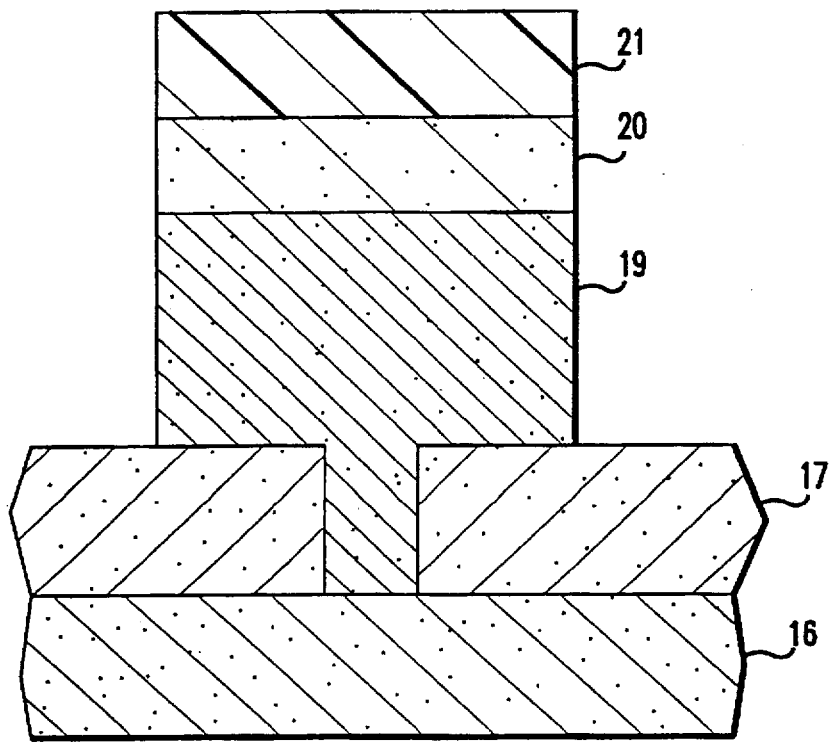
Figure 15E:
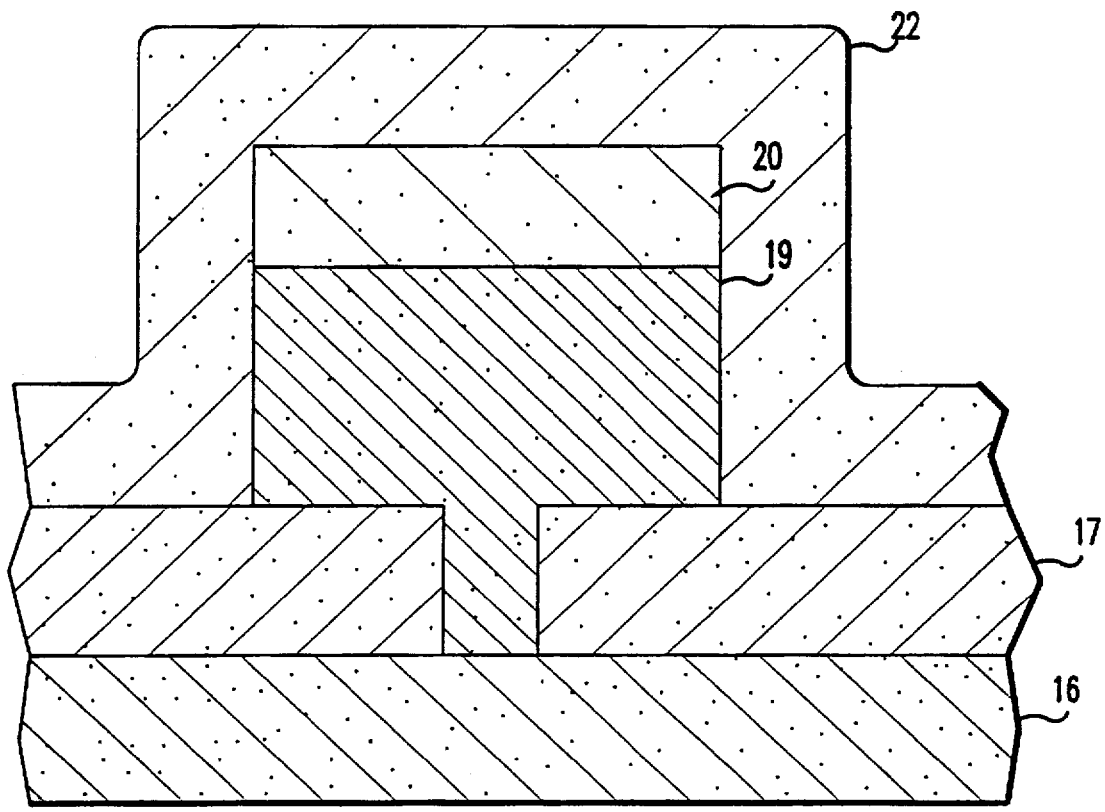
Figure 15F:
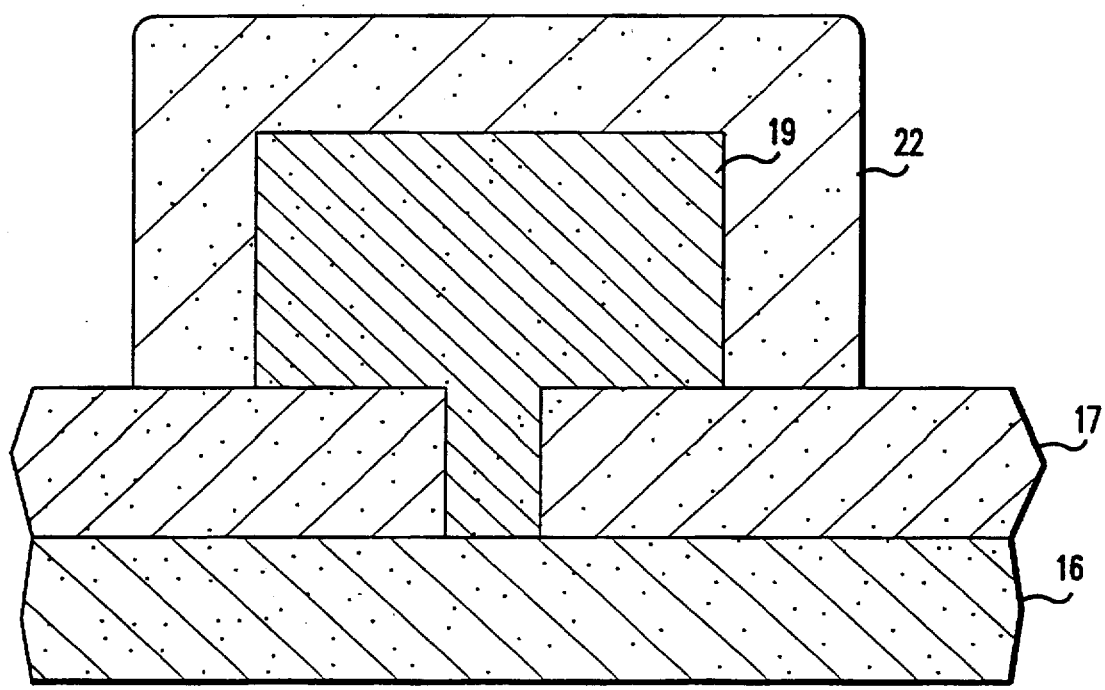
Figure 15G:
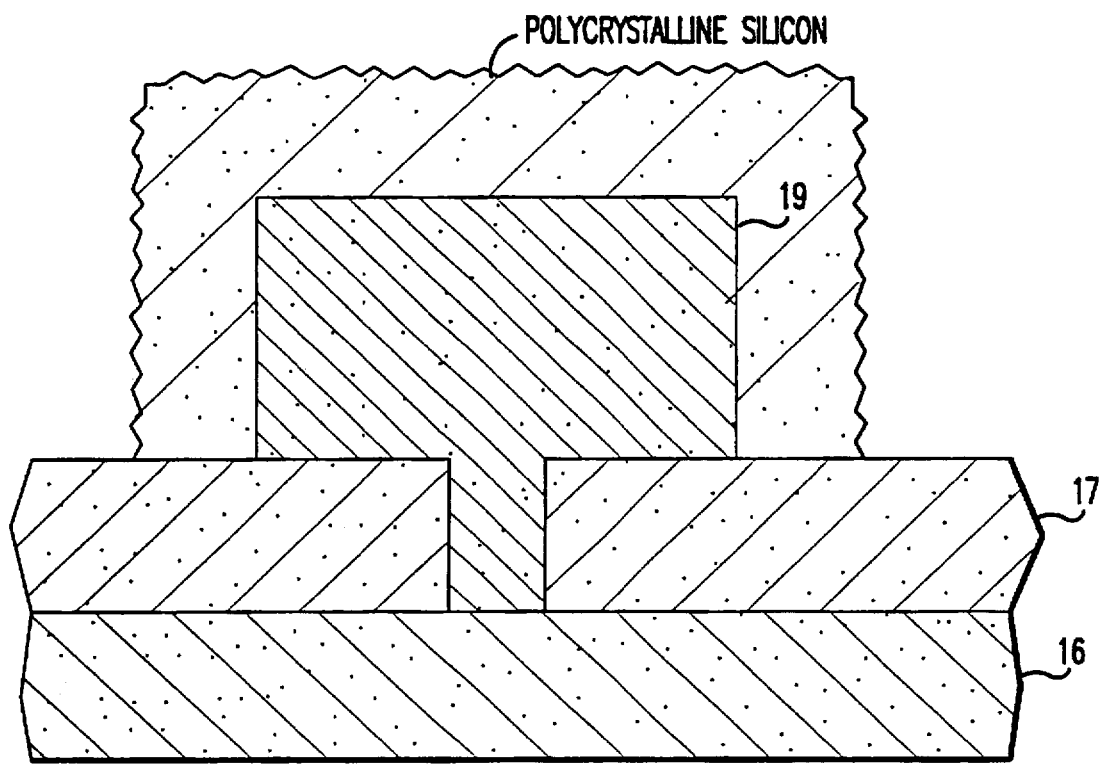
Figure 15H:
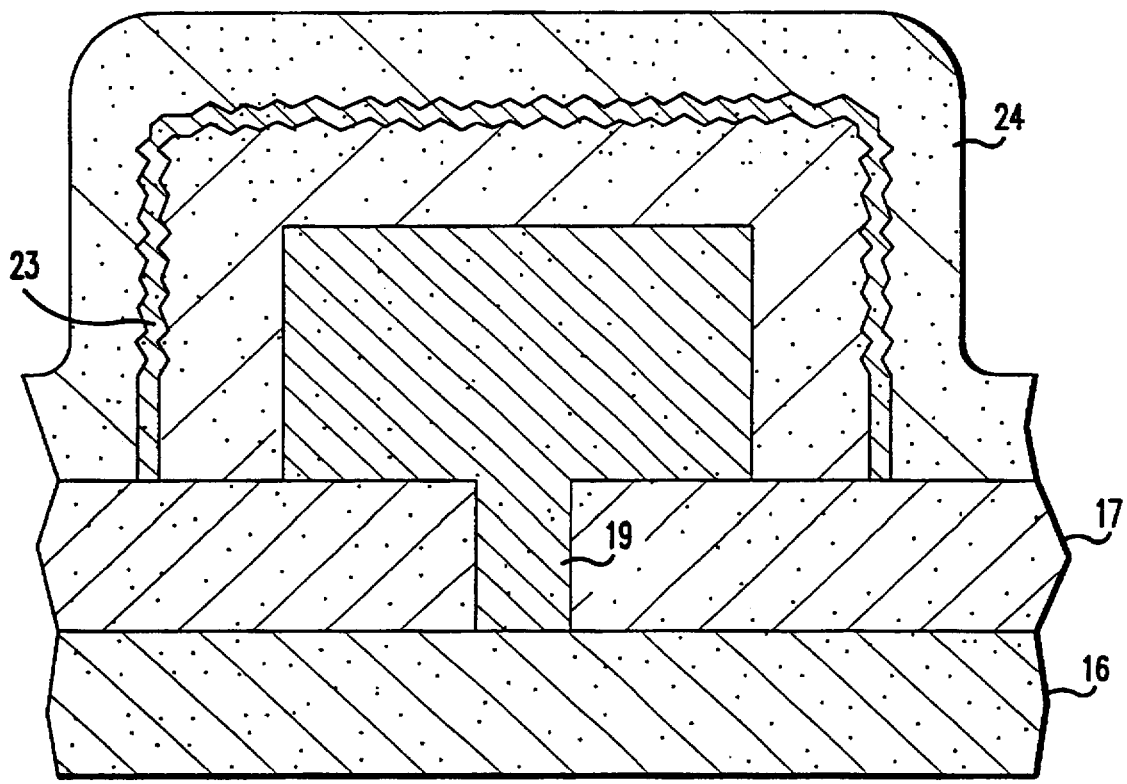

The present embodiment will be described in its application to the electrode of a simple cubic structure as in Embodiment 1. First, as shown in FIG. 15(a), an oxide film 17 was formed on a silicon substrate 16 and applied a resist 18 on the surface to be patterned. Then, the oxide film 17 was given a dry etching (FIG. 15(b)). Then, as shown in FIG. 15(c), a polycrystalline silicon 19 was deposited and an impurity such as phosphorus or arsenic was doped by thermal diffusion. The polycrystalline silicon film 19 was deposited by an LPCVD method under the ordinary conditions of a temperature of 600° C. and a pressure of 1 Torr using a mixed gas of $SiH_4$ and He (at 20 vol % of $SiH_4$ and 80 vol % of He). An amorphous silicon film 20 was deposited on top of it at 500° C. The growth conditions other than that of the temperature are the same as for the case of deposition of the polycrystalline silicon film at 600° C. The amorphous silicon film was coated with a resist 21 and patterned (FIG. 15(c)). Then the amorphous silicon film 20 and the polycrystalline silicon film 19 were dry etched using the resist 21 as a mask (FIG. 15(d)). After removal of the resist 21 an amorphous silicon film 22 was deposited by an LPCVD method to a thickness of 2000 Å (FIG. 15(e)). The deposition conditions were a temperature 510° C., a mixed gas of $SiH_4$ and He (at 20 vol % of $SiH_4$ and 80 vol % of He) and a pressure of 1 Torr. Then, the amorphous silicon film 22 was processed by RIE to form an electrode (FIG. 15(f)). Following the above, the surface was washed with a mixed solution of ammonia and hydrogen peroxide in order to remove carbon contamination on the amorphous silicon film 22, and further, a native oxide film was removed using HF or etching. Then, the sample was introduced into a vacuum of $1 \times 10^{-7}$ Torr to be heated at 600° C. for one hour. As a result of the heat treatment, unevenness was formed on the electrode surface (FIG. 15(g)). Next, the electrode was heated at about 800° C. By this treatment, a conductive impurity such as phosphorus or arsenic is injected from the lower electrode into the silicon film that has a unevenness. After that, a capacitor insulating film 23 and an upper electrode 24 were formed (FIG. 15(h)). The factor of surface area increase of the capacitor formed as above is very high being about 2.1 times that of a silicon film deposited in accordance with the conventional method.

Embodiment 7

Figure 16:
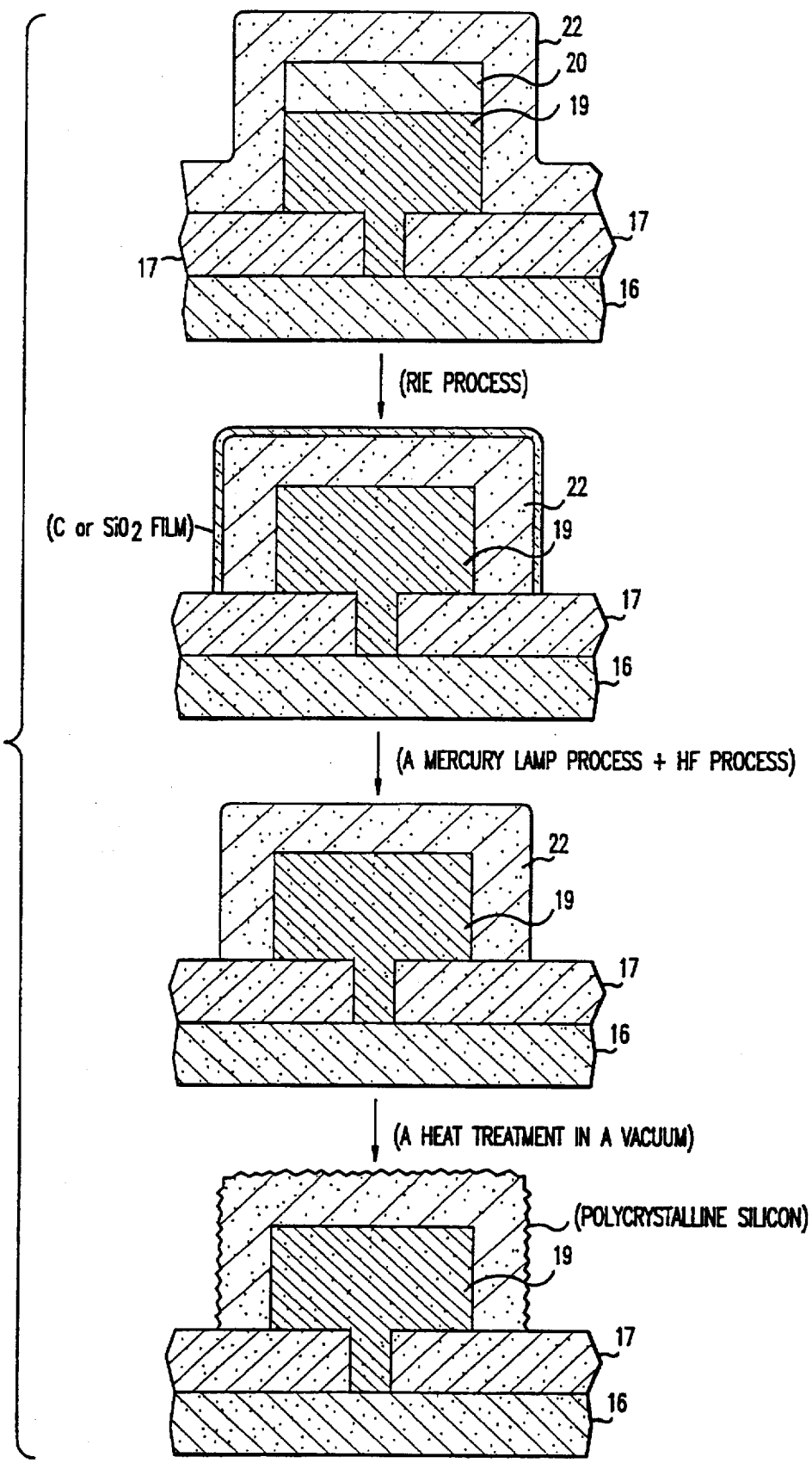
FIG. 16 shows sectional views for different fabrication processes according to embodiment 7 of the present invention.

In the fabrication method of Embodiment 6 carbon atoms may have a chance of being attached to the surface of the amorphous silicon film after the RIE treatment. If carbon atoms remain on the amorphous silicon surface, unevenness will not be formed on the surface of the amorphous silicon even if it is heated in vacuum, because the surface migration of the silicon atoms is restrained by the carbon atoms. These carbon atoms may be removed by washing with a mixed solution of ammonia and hydrogen peroxide. However, by employing a method of removing carbon by reduction at a low temperature by means of an optical surface treatment (using a mercury lamp of a wavelength of 200 to 400 nm and an intensity of 110 mW/cm² at a pressure of 1 Torr) that employs ozone gas a cleaner silicon surface can be obtained in a simple manner. Following the above treatment it is possible to start crystallization from the surface of the amorphous silicon film and to form a dense unevenness on the surface of the silicon film by removing the spontaneously oxidized film and then subjecting the sample to a heat treatment in a vacuum or in a nonoxidizing atmosphere such as that of an inert gas. The relevant mechanism is illustrated in FIG. 16.

Instead of the optical surface treatment method using ozone gas that was employed in the embodiment 7, an optical surface treatment method that uses a halogen gas may be adopted to simultaneously remove carbon, the spontaneously oxidized film and the portions of the silicon film that sustained damage by the RIE from the amorphous silicon film after the RIE. Chlorine gas may be used as the halogen gas. Further, the lamp to be used may be a mercury lamp of a wavelength of 300 to 400 nm operated at 200 m Torr and power of 110 mW/cm². After this optical surface treatment, by subjecting the amorphous silicon film to a heat treatment in a vacuum or in a nonoxidizing atmosphere such as that of an inert gas, crystallization can be started from the amorphous silicon surface and form a dense unevenness on the surface of the silicon film.

Embodiment 8

Although the formation of unevenness all over the electrode of the stacked capacitor as above is an effective method for increasing the effective surface area, it is not always advantageous to form the unevenness all over the surface for the reason of the structure of the device. Under these circumstances, there is a fabrication method which makes it possible to selectively grow unevenness only at those locations where the formation of the unevenness is desired.

The fabrication method will be described below with a dual cylinder structure as an example.

Figure 17A:
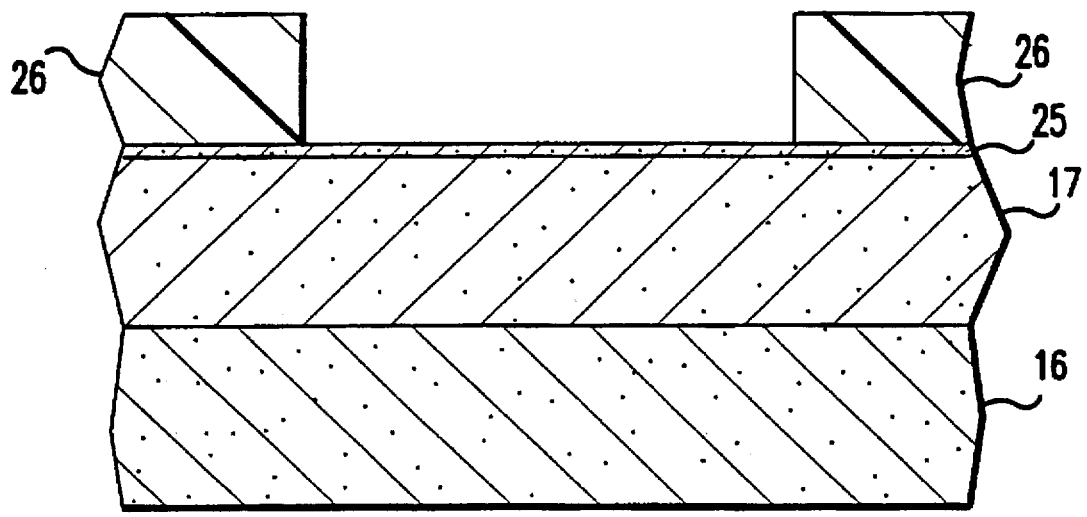
FIG. 17 shows sectional views for different fabrication processes of embodiment 8 of the present invention.
Figure 17B:
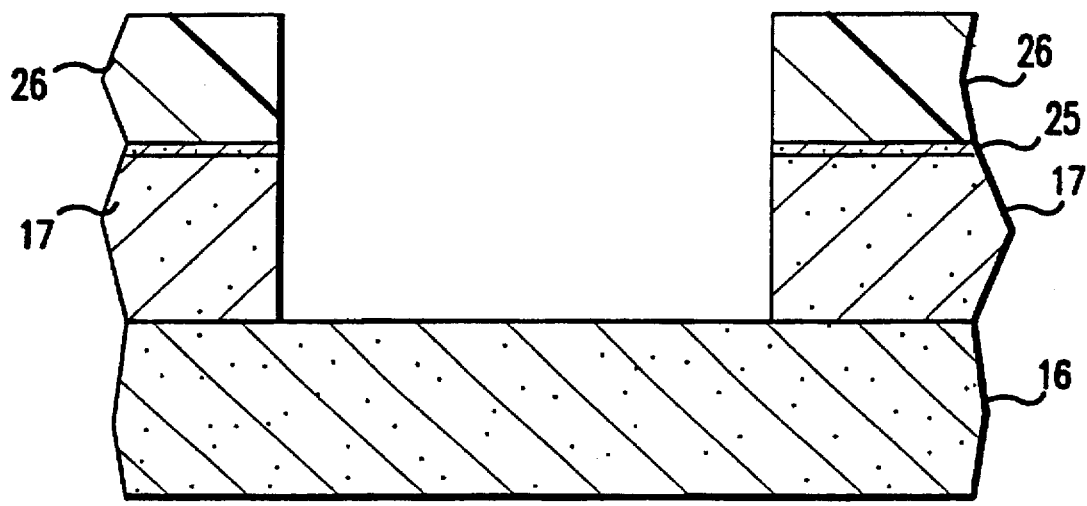
Figure 17C:
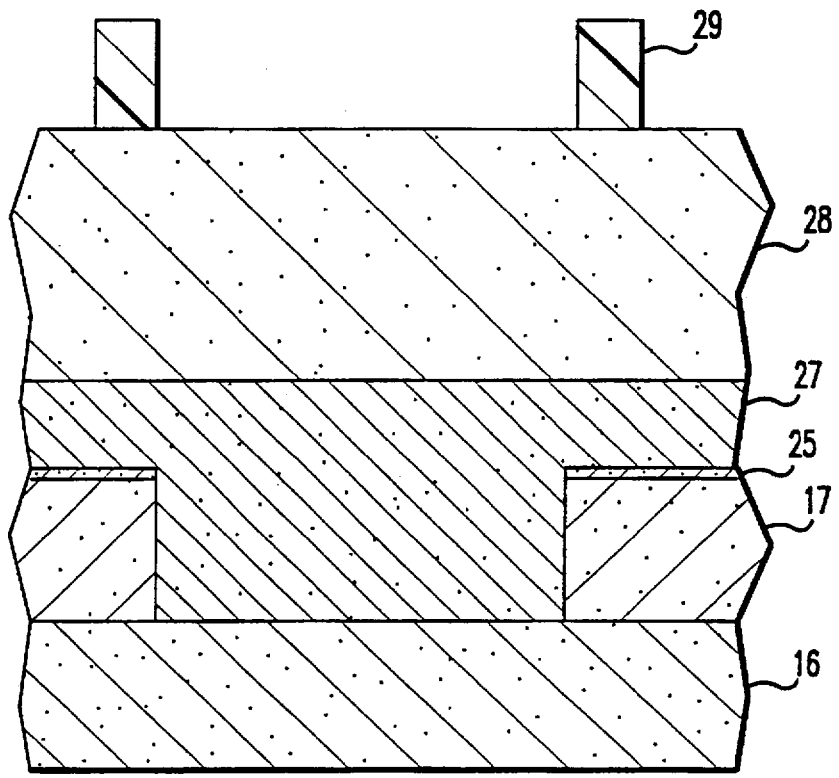
Figure 17D:
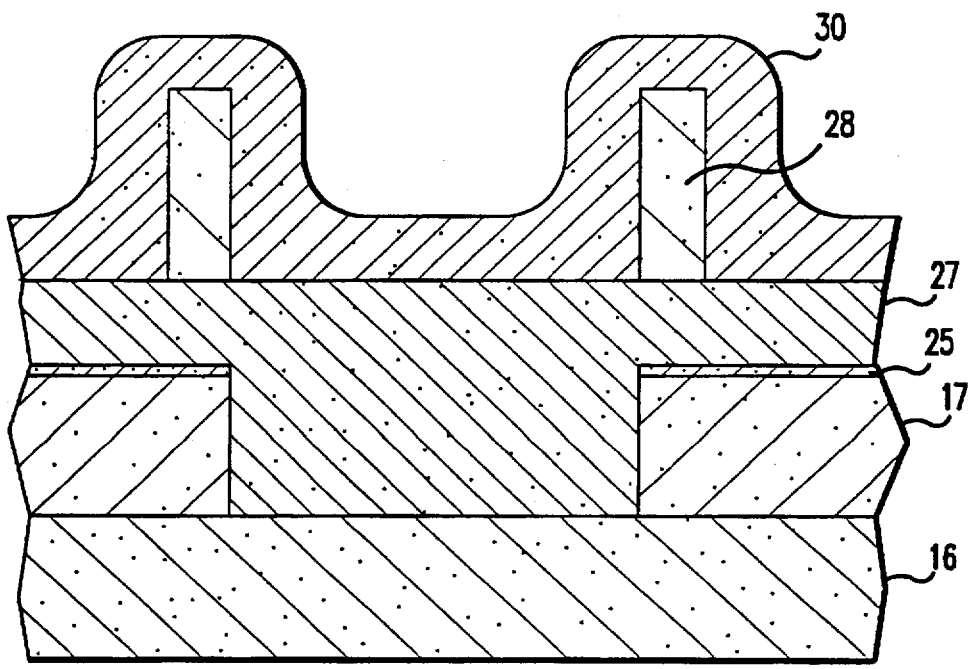
Figure 17E:
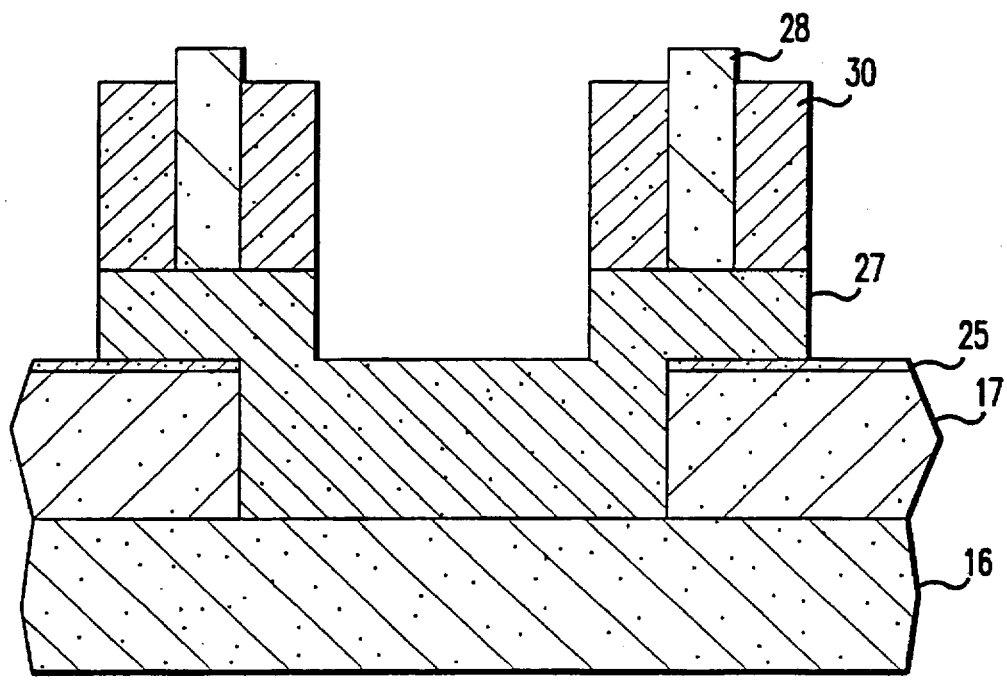
Figure 17F:
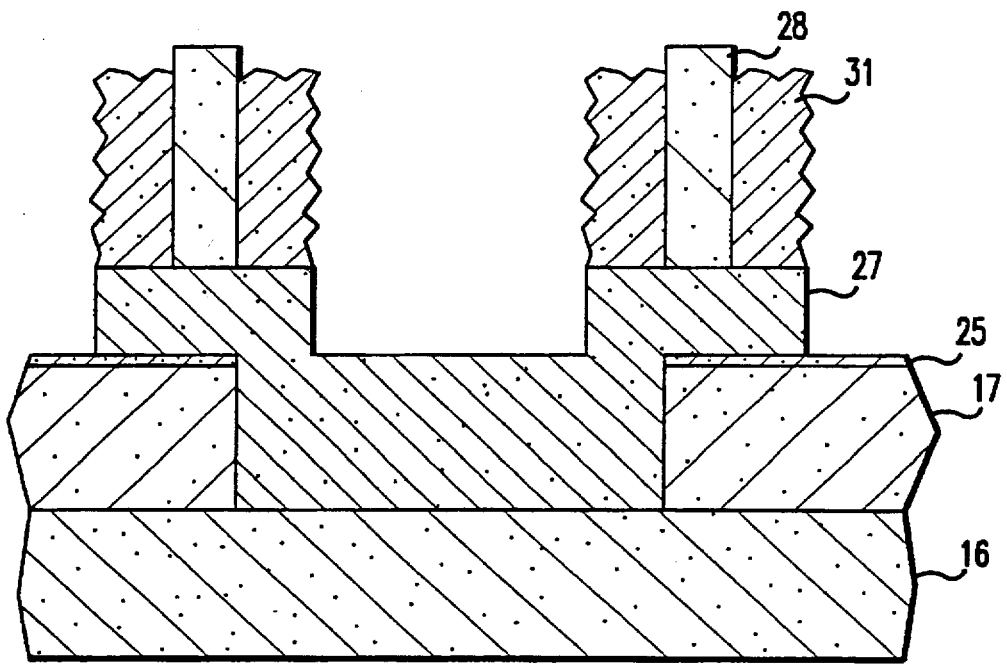
Figure 17G:
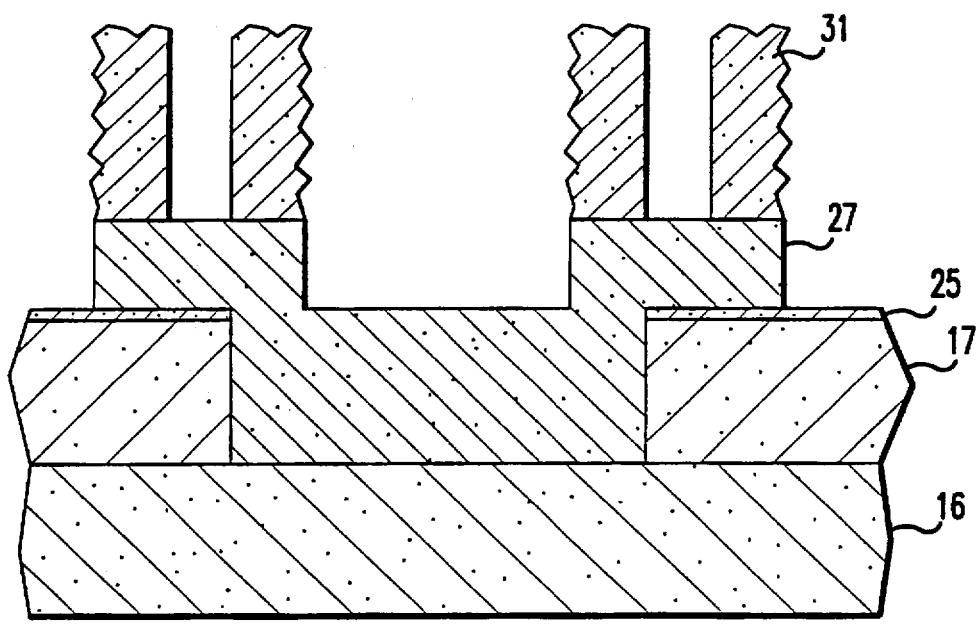
Figure 17H:
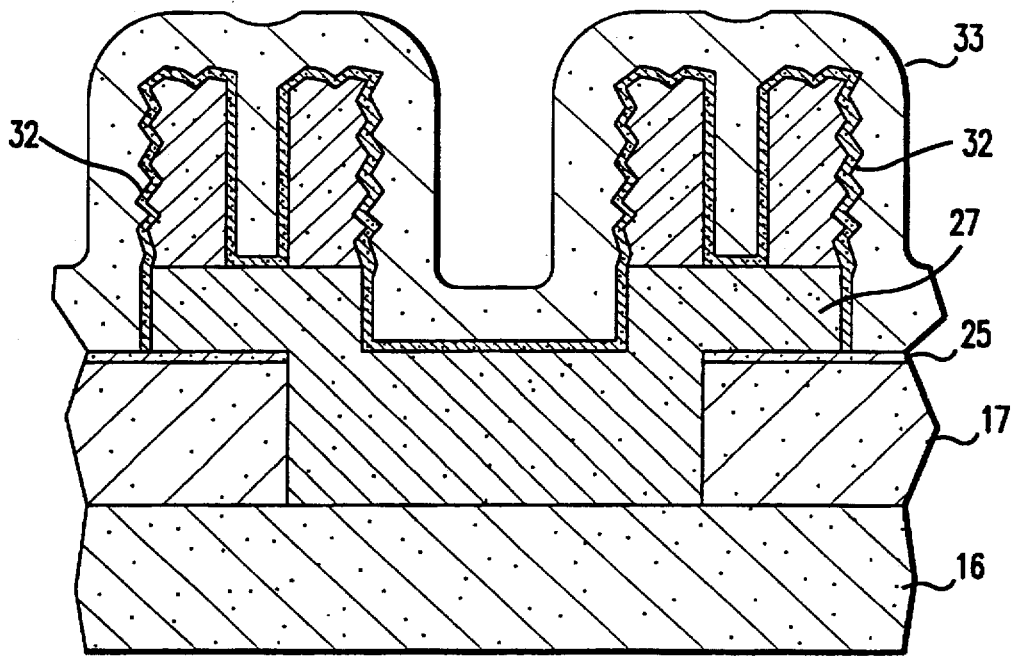

First, as shown in FIG. 17(a), a silicon nitride film 25 and an oxide film 17 were formed on a silicon substrate 16. Then a resist 26 was applied to the surface and patterned. Then the oxide film 17 and the silicon nitride film 25 were dry etched, as shown in FIG. 17(b). The resist 16 was removed. A polycrystalline silicon film 27 was deposited as shown in FIG. 17(c) by an LPCVD method under the ordinary conditions of a temperature of 600° C., a reaction gas which is a mixture of $SiH_4$ and He (at 20 vol % of $SiH_4$ and 80 vol % of He) and at a pressure of 1 Torr. Then an impurity such as P, phosphorus or arsenic was doped by thermal diffusion. A high temperature oxide (HTO) CVD oxide film 28 was deposited on top of it to a thickness of 4000 Å under the deposition conditions of a temperature of 600° C., a reaction gas which is a mixture of $SiH_4$, He (at 20 vol % of $SiH_4$ and 80 vol % of He) and $N_2O$ gas (in the flow rate of one in $SiH_4$+He to five in $N_2O$) and a pressure of 1 Torr. A resist 29 was applied on the surface of the oxide film 28 and then patterned (FIG. 17(c)). The oxide film 28 was dry-etched using the resist 29 as a ask. Then the resist 29 was removed and an amorphous silicon film 30 was deposited to a thickness of 1500 Å (FIG. 17(d)). Following the above, the amorphous silicon 30 and a part of polycrystalline silicon film 27 was processed by RIE to form an electrode (FIG. 17(e)). Then, the carbon contamination on the amorphous silicon film was removed by washing with a mixed solution of ammonia and hydrogen peroxide. Then the spontaneously oxidized film was removed by using HF. Next, the sample was introduced to a vacuum of $1 \times 10^{-7}$ Torr and was subjected to a heat treatment at 600° C. for one hour. Unevenness was formed on the electrode surface by this heat treatment (FIG. 17(f)). Then the oxide film 28 between the pieces of the electrode 31 was removed by wet etching by using a mixed solution of HF and water in the ratio of 1 to 100. Finally, a capacitor was completed by depositing a capacitor insulating film 32 and a phosphorus-doped polycrystalline silicon film 33 (FIG. 17(g) and 17(h)).

Embodiment 9

This embodiment shows the method for fabricating a cylinder like shaped electrode having unevenness on the surface. This electrode serves as a stacked capacitor electrode.

Figure 18A:
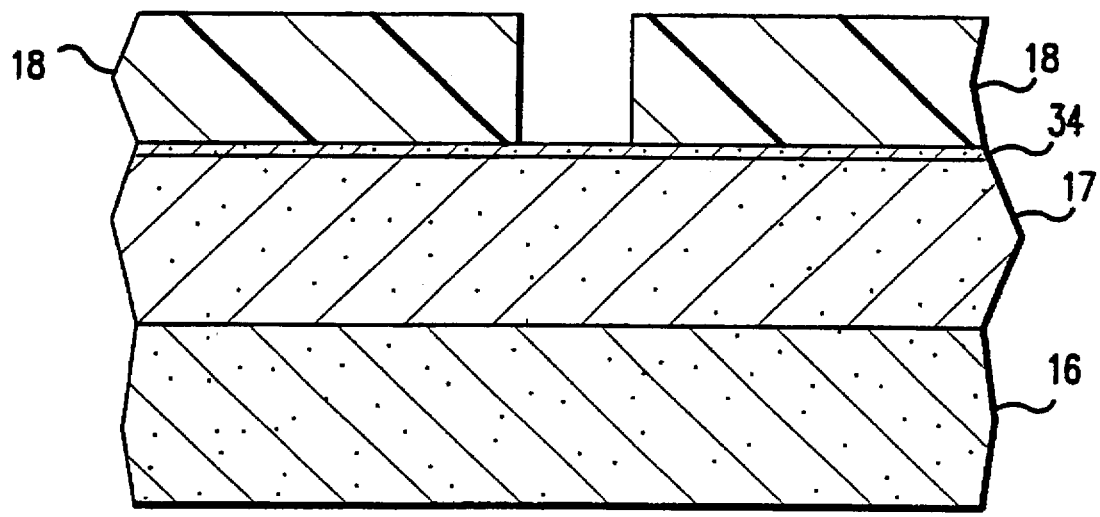
FIG. 18 shows sectional view for different fabrication processes according to embodiment 9 of the invention.
Figure 18B:
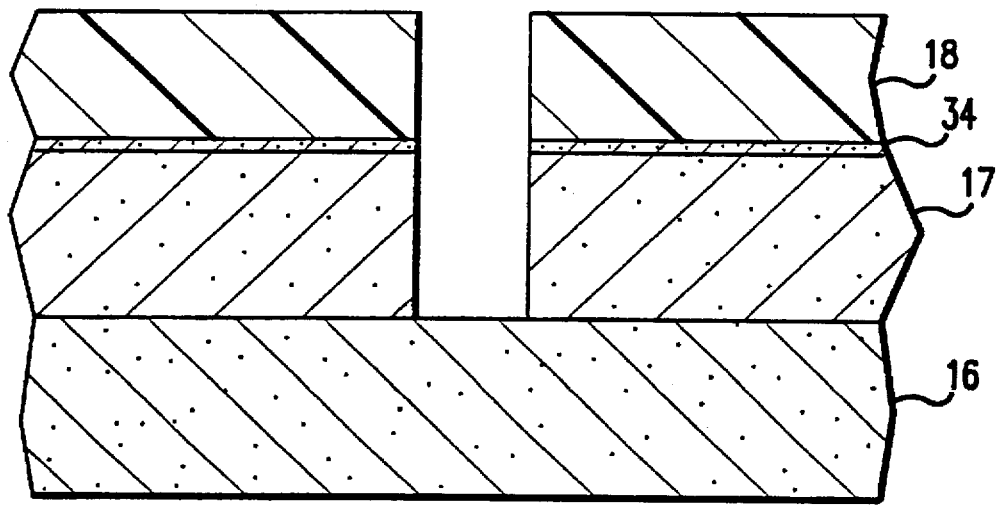
Figure 18C:
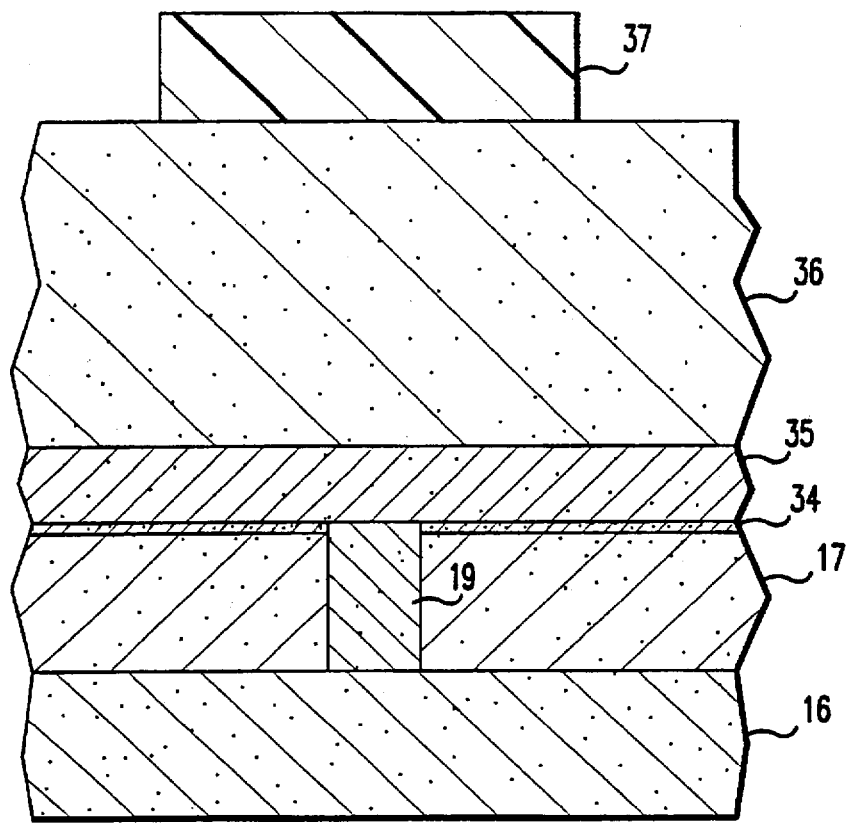
Figure 18D:
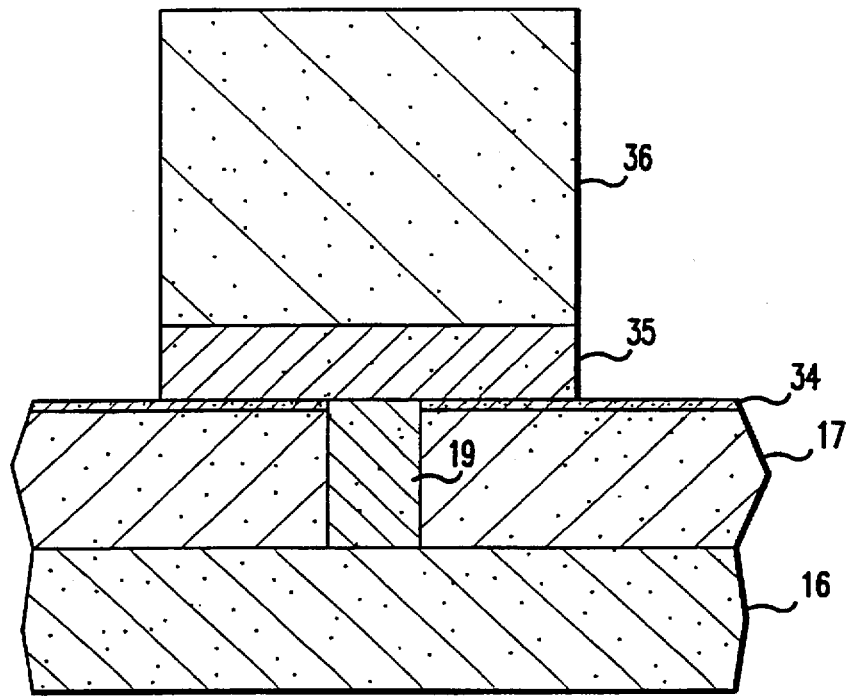
Figure 18E:
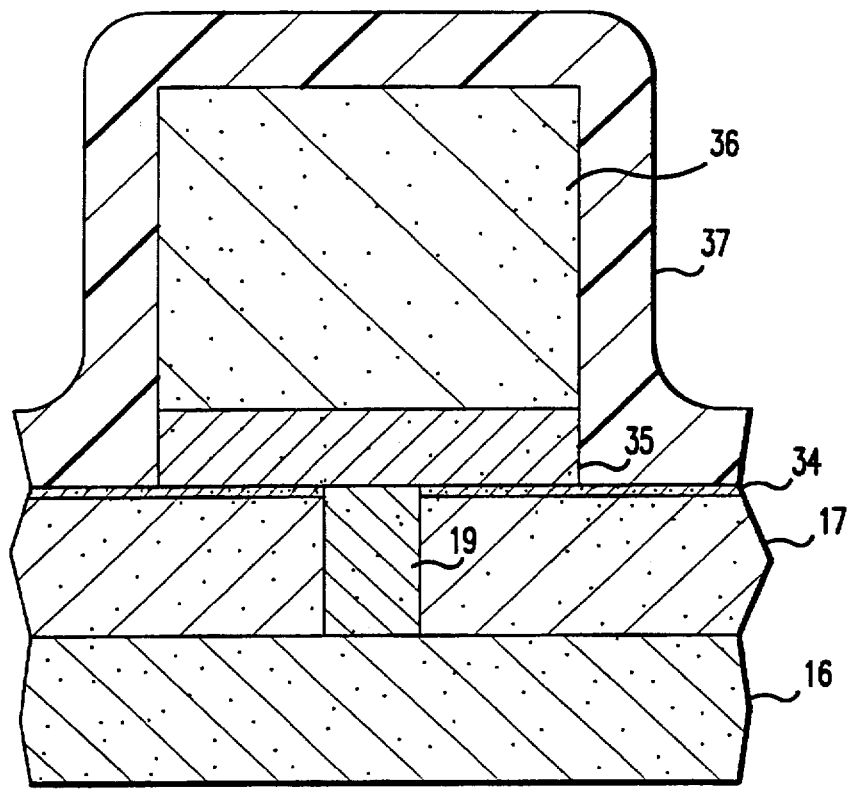
Figure 18F:
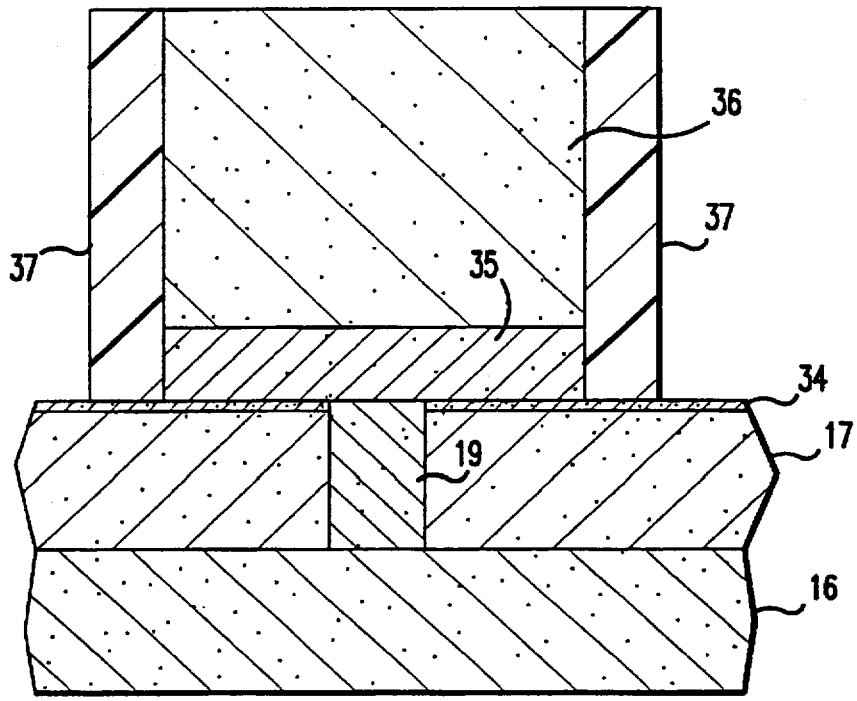
Figure 18G:
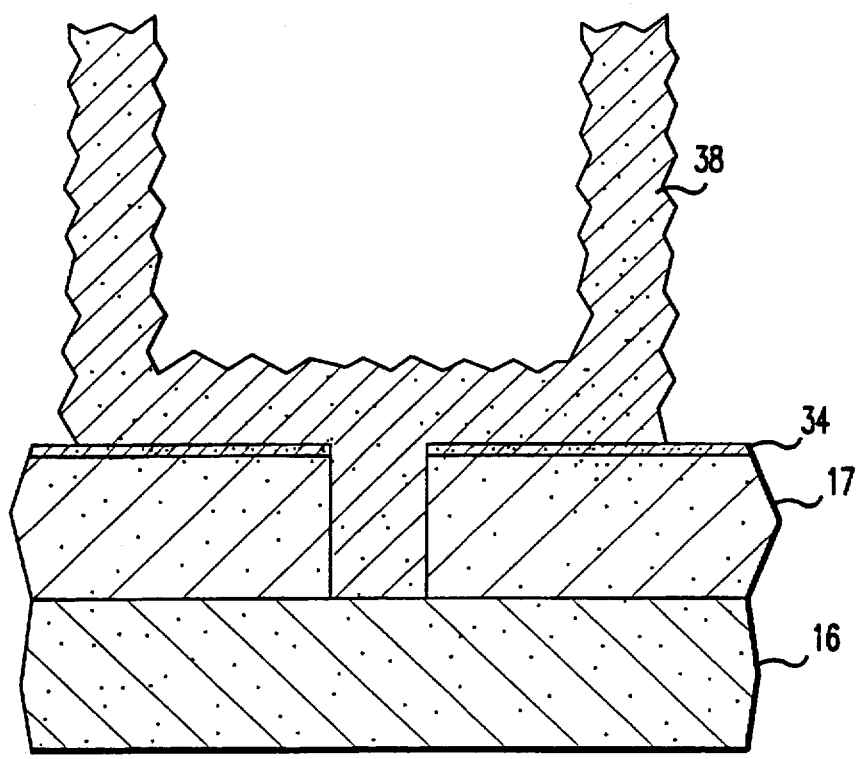
Figure 18H:
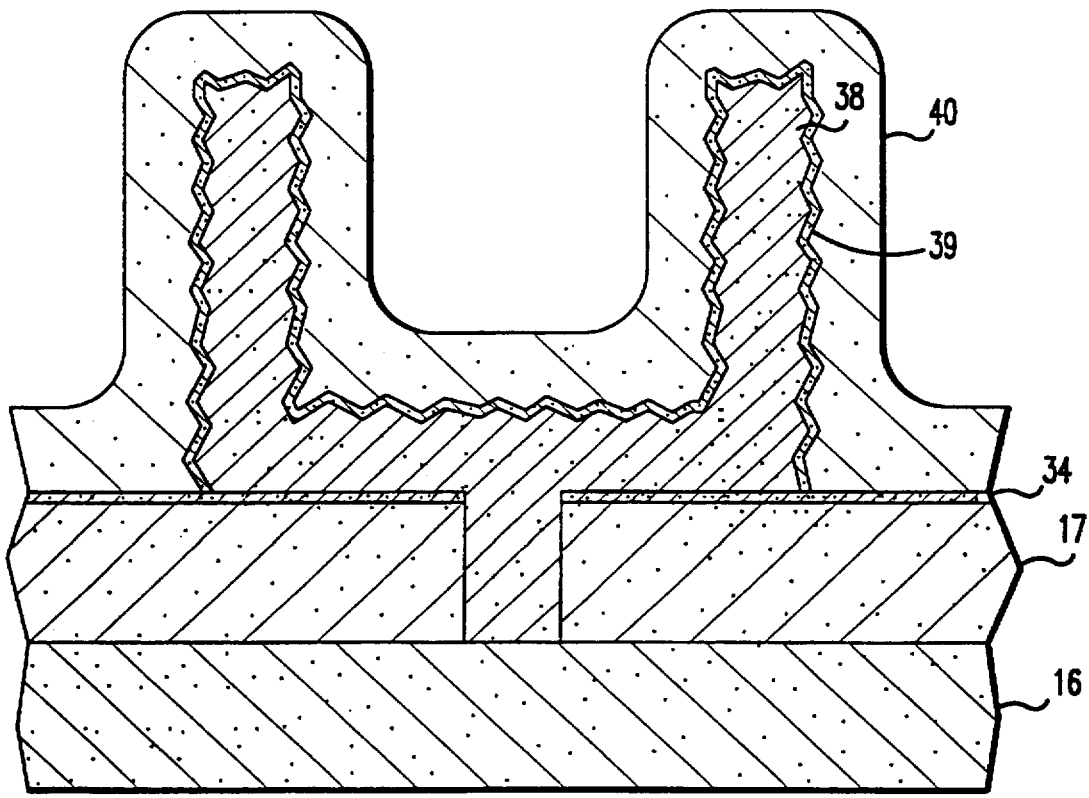
Figure 19:
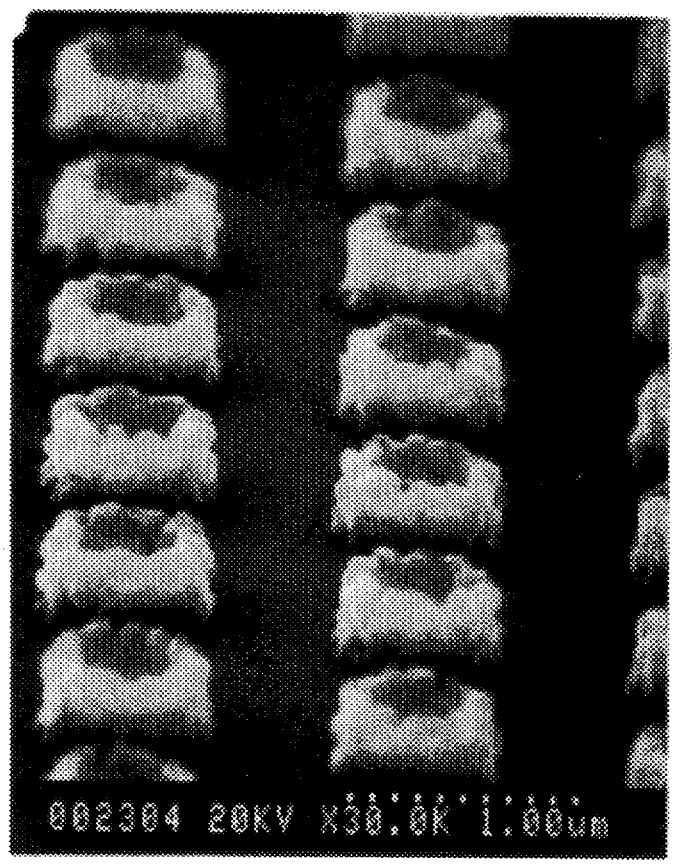
FIG. 19 shows a scanning electron microphotograph that illustrates the phenomenon described in FIG. 18g.

First, as shown in FIG. 18a, a silicon oxide film 17 is formed on a silicon substrate 16. Then a silicon nitride film 34 is formed on the silicon oxide film 17 and a resist 18 is coated on this film 34 and patterned. Using the patterned resist 18 as a mask, the silicon nitride film 34 and the silicon oxide film 17 are etched by dry etching, and thereafter the resist 18 is removed (FIG. 18b). Next, as shown in FIG. 18c, a polycrystalline silicon film 19 is deposited, and an impurity such as phosphorus or arsenic is doped by thermal diffusion. Then the polycrystalline silicon film 19 is etched back until the upper surface of the silicon nitride film 34 is exposed, and it remains only in the through hole of the silicon oxide film 17. Then an amorphous silicon film 35 is opposite on the silicon nitride film 34 and a silicon oxide film 36 is deposited by the CVD method at a temperature of 550° C. (510° C.). The thickness of the silicon oxide film 36 is defined by the height of the desired electrode. Next, as shown in FIG. 18c, a resist 37 is coated on the silicon oxide film 36 and patterned. Using the resist 37 as a mask, the silicon oxide film 36 and the amorphous silicon 35 are etched by dr etching and the resist 37 is removed (FIG. 18d). Then, an amorphous silicon film 37 is deposited on the silicon oxide film 36 and the amorphous silicon film 35 by the same fabrication method of the amorphous silicon film 33 (FIG. 18e). Then, the amorphous silicon film 37 is etched back till the top surface of the silicon oxide film 36 is exposed (FIG. 18f). Then the silicon oxide film 36 is removed by the HF process. But this process produces a native oxide film on the amorphous silicon 35, 37. To remove the native oxide film, this film is washed with a mixed solution of ammonia and hydrogen peroxide and washed with the solution of HF. After this cleaning of the amorphous silicon surface, the sample is annealed at a temperature of 600° C., a pressure of 1 Torr and an annealing time of 10 Minutes. By this treatment, the amorphous silicon 35, 37 become a polycrystalline silicon 38 having the unevenness on its surface (FIG. 18g). FIG. 19 is a scanning electron microscopy photograph of he sample of FIG. 18g. After this sample is taken out in air, the sample is ion implanted under the condition of a concentration of phosphorus $10^{20}$ atoms/cm$^3$ and an angle of incidence of 7 degrees, so that the surface part of the polycrystalline silicon 38 contains a high concentration of phosphorus. Then the sample is annealed at a temperature of 800° C. to activate the impurity of phosphorus and treatment for the lower-electrode of a stacked capacitor is completed. Then, like embodiment 1, a capacitor insulating film 39 is formed on the polycrystalline silicon 38 and a phosphorus-doped polycrystalline silicon film 40 is deposited (FIG. 18h).

In this embodiment 9, the silicon nitride film 34 may be omitted and the amorphous silicon film 35 may be deposited on the surface of the silicon oxide film 17.

It should be mentioned that the shape of the storage electrode with unevenness for a stacked capacitor may be a plain cubic structure, a cylindrical structure, a fin-type structure or a stacked trench type.

It is apparent that the present invention is not limited to the above embodiments but may be modified and changed without departing from the scope and spirit of the invention.

What is claimed is:

1. A method for fabricating a semiconductor device having a memory cell which includes a capacitor, said capacitor having a first electrode, a second electrode and a dielectric layer intervening between said first and second electrodes, said method comprising the steps of:

depositing an amorphous silicon layer on a substrate;

performing an annealing process to form a plurality of crystalline nuclei on said amorphous silicon layer and grow said crystalline nuclei to thereby form a plurality of polycrystalline silicon grains, said amorphous silicon layer being thereby converted into a silicon layer having an uneven surface and serving said first electrode of said capacitor;

forming a dielectric film on the uneven surface of said silicon layer, said dielectric film serving as said dielectric layer of said capacitor; and forming a conductive layer on said dielectric film, said conductive layer serving as said second electrode of said capacitor.

2. The method as claimed in claim 1, wherein said step of performing an annealing process is carried out at a temperature that is higher than a transition temperature from an amorphous phase to a polycrystalline phase of silicon.

3. The method as claimed in claim 1, wherein said step of performing an annealing process is carried out at a temperature in a range between 580° C. and 750° C.

4. A method for fabricating a semiconductor device comprising the steps of:

depositing an amorphous silicon layer on a substrate;

cleaning said amorphous silicon layer, said amorphous silicon layer thereby having an oxide-free surface;

annealing said substrate in such a state that said amorphous silicon layer keeps said oxide-free surface, said amorphous silicon layer being thereby converted into a silicon layer having a plurality of silicon grains grown from a surface of said silicon layer, said silicon layer having an uneven surface;

forming a dielectric layer on the uneven surface of said silicon layer; and forming a conductive layer on said dielectric layer.

5. The method as claimed in claim 4, wherein said step of annealing is performed at a temperature in a range of 580° C. to 750° C.

6. The method as claimed in claim 4, wherein said step of cleaning is performed by subjecting said amorphous silicon layer to hydrofluoric acid (HF).

7. A method for fabricating a semiconductor device comprising the steps of:

forming an impurity-doped silicon layer on a substrate;

forming an amorphous silicon layer on said impurity-doped silicon layer;

annealing said substrate to form a plurality of crystalline nuclei on a surface of said amorphous silicon layer and grow said crystalline nuclei to thereby form a plurality of silicon grains, said amorphous silicon layer being thereby converted into a silicon layer having an uneven surface;

doping impurities contained in said impurity-doped silicon layer from said impurity-doped silicon layer into said silicon layer having the uneven surface;

forming a dielectric layer on the uneven surface of said polycrystalline silicon layer; and forming a conductive layer on said dielectric layer.

8. The method as claimed in claim 7, further comprising the step of cleaning a surface of said amorphous silicon layer before the step of annealing, said amorphous silicon layer being thereby annealed after said amorphous silicon layer has an oxide-free surface.

9. The method as claimed in claim 8, wherein said step of cleaning is performed by a hydrofluoric acid (HF).

10. The method as claimed in claim 7, wherein said impurity-doped silicon layer having a top surface and a side surface, said amorphous silicon layer being formed on the top and side surfaces of said impurity-doped silicon layer to thereby having a top surface and a side surface, and said plurality of silicon grains being thereby grown from both of the top and side surfaces of said amorphous silicon layer.

11. A method for fabricating a semiconductor device comprising the steps of:

forming an impurity-doped silicon layer on a substrate;

forming a plurality of amorphous silicon projections on said impurity-doped silicon layer;

annealing said substrate to grow a plurality of polycrystalline silicon grains from a surface of each of said amorphous silicon projections, said amorphous silicon projections being thereby converted respectively into silicon layers each having an uneven surface;

forming a dielectric film on the uneven surface of each of said silicon layers and on a surface of said impurity-doped silicon layer; and forming a conductive layer on said dielectric layer.

12. The method as claimed in claim 11, wherein each of said amorphous silicon layers is cleaned to provide an oxide-free surface before the step of annealing.

13. A method for fabricating a semiconductor device comprising the steps of:

forming an amorphous silicon layer on a substrate, said amorphous silicon layer having a horizontal portion and a vertical portion projecting from said horizontal portion;

cleaning said amorphous silicon layer, each of said horizontal portion and said vertical portion of said amorphous silicon layer thereby having an oxide-fee surface;

annealing said substrate in a condition that each of said horizontal portion and said vertical portion of said amorphous silicon layer keeps said oxide-free surface to thereby form a plurality of crystalline nuclei on each of surfaces of said horizontal portion and said vertical portion of said amorphous silicon layer and grow said crystalline nuclei to form a plurality of silicon grains, said amorphous silicon layer being thereby converted into a silicon layer having an uneven surface;

forming a dielectric layer on the uneven surface of said silicon layer; and forming a conductive layer on said dielectric layer.

14. The method as claimed in claim 13, wherein said step of cleaning is performed by a hydrofluoric acid (HF).

15. A method of fabricating a semiconductor capacitor having a first electrode, a second electrode, and a dielectric disposed between said first electrode and said second electrode, comprising the steps of:

forming said first electrode by depositing an amorphous silicon layer over a substrate and annealing at a temperature above a transition temperature so that a plurality of crystalline nuclei grow to form polycrystalline grains at the surface of said electrode and thereby create a first electrode having an uneven surface;

forming said dielectric layer on said first electrode with a thickness such that opposing surfaces of said dielectric layer are substantially parallel and substantially replicate said uneven surface of said first electrode;

forming said second electrode on and conformal to said dielectric layer, whereby capacitance between said first electrode and said second electrode is increased by said uneven surface.

16. The method as claimed in claim 15, wherein a surface of said amorphous silicon is maintained in an oxide-free and carbon-free state.

17. The method as claimed in claim 16, wherein said annealing is performed in a vacuum higher than $1 \times 10^{-6}$ Torr.

18. The method as claimed in claim 16, wherein said annealing is performed in an inert gas.

19. The method as claimed in claim 15, wherein said annealing is carried out at a temperature in a range between 580° C. and 750° C.

20. The method as claimed in claim 15, wherein said step of forming said first electrode comprises the steps of:

forming a polycrystalline silicon layer on a substrate; and selectively forming said amorphous silicon on said polycrystalline layer.

* * * * *